US006853443B2

US 6,853,443 B2

(12) United States Patent
Nishi

(10) Patent No.: US 6,853,443 B2
(45) Date of Patent: Feb. 8, 2005

(54) EXPOSURE APPARATUS, SUBSTRATE PROCESSING SYSTEM, AND DEVICE MANUFACTURING METHOD

(75) Inventor: Kenji Nishi, Yokohama (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 10/310,036

(22) Filed: Dec. 5, 2002

(65) Prior Publication Data

US 2003/0117596 A1 Jun. 26, 2003

Related U.S. Application Data

(63) Continuation of application No. PCT/JP02/03318, filed on Apr. 3, 2002.

(30) Foreign Application Priority Data

Apr. 6, 2001 (JP) ........................................ 2001-108334

(51) Int. Cl.[7] .......................... G03B 27/58; G03B 27/62
(52) U.S. Cl. .......................................... 355/72; 355/75
(58) Field of Search ...................................... 355/72, 75

(56) References Cited

U.S. PATENT DOCUMENTS

| 5,767,948 | A | * | 6/1998 | Loopstra et al. ............... 355/53 |
| 5,844,666 | A | | 12/1998 | Van Engelen et al. |
| 6,341,007 | B1 | | 1/2002 | Nishi et al. |
| 6,512,571 | B2 | * | 1/2003 | Hara ............................ 355/53 |
| 6,529,260 | B2 | * | 3/2003 | Sogard ......................... 355/39 |
| 6,538,719 | B1 | * | 3/2003 | Takahashi et al. ............ 355/53 |
| 2002/0012108 | A1 | * | 1/2002 | Hara ............................ 355/53 |
| 2002/0163631 | A1 | * | 11/2002 | Sogard ......................... 355/74 |
| 2003/0030779 | A1 | * | 2/2003 | Hara ............................ 355/53 |

* cited by examiner

Primary Examiner—Rodney Fuller
(74) Attorney, Agent, or Firm—Oblon, Spivak, McClelland, Maier & Neustadt, P.C.

(57) ABSTRACT

A first main body unit for supporting a substrate stage is supported at four points by vibration isolators, and a second main body unit is supported on the first main body unit at three points by second vibration isolators. This allows the first main body unit and the substrate stage to be supported stably with high rigidity, and for example, allows maintenance on the stage portion from the back side of the apparatus, which is not possible with the first main body unit supported at three points. Further, the apparatus comprises vibration isolation units connected in series in two platforms, which has a great effect of suppressing background vibration from the floor surface. Accordingly, exposure with high precision can be performed which improves the yield of devices, and the reduced maintenance time can improve the operation rate, consequently leading to an improvement in productivity of devices as end products.

10 Claims, 21 Drawing Sheets

EXPOSURE APPARATUS, SUBSTRATE PROCESSING SYSTEM, AND DEVICE MANUFACTURING METHOD

CROSS-REFERENCE TO RELATED APPLICATIONS

This is a continuation of International Application PCT/JP02/03318, with an international filing date of Apr. 3, 2002, the entire content of which being hereby incorporated herein by reference, which was not published in English.

BACKGROUND OF THE INVENTION

1. Field of the Invention

The present invention relates to exposure apparatus, substrate processing systems, and device manufacturing methods, and more particularly to an exposure apparatus used in a lithographic process when manufacturing devices such as a semiconductor device, a liquid crystal display device, a plasma display device, or a thin film magnetic head, a substrate processing system having the exposure apparatus and a substrate processor connected inline to the exposure apparatus, and a device manufacturing method using the exposure apparatus.

2. Description of the Related Art

In conventional lithographic process for manufacturing devices such as semiconductors, various exposure apparatus have been used. In recent years, the ones mainly used are projection exposure apparatus that move in a step-by-step fashion, such as a reduction projection exposure apparatus based on a step-and-repeat method, that is, the so-called stepper, or a scanning projection exposure apparatus based on a step-and-scan method, that is, the so-called scanning stepper.

While the degree of integration increases in semiconductor devices, the device rule (practical minimum, line width) is decreasing, and in order to comply with such a situation, exposure apparatus require high exposure accuracy. In addition, since these types of exposure apparatus are used for mass-production of devices, high throughput is naturally required, in addition to exposure accuracy.

Exposure accuracy has been improved, conventionally, by measures such as increasing the number of numerical apertures (N.A.) in a projection optical system to improve the resolution, and improving the positional controllability of a wafer stage (in the case of a stepper) or a wafer stage and a reticle stage (in the case of a scanning stepper). Furthermore, throughput has been improved, mainly by increasing the speed of above stages or the like.

Recently, however, the degree of integration in semiconductor devices is increasing intensely, and with such situation exposure apparatus are also facing further requirements for improvement in their performance. It is, however, becoming difficult to achieve the recent tight requirements by the conventional methods referred to above or by similar methods. That is, the numerical aperture of the projection optical system cannot be increased too much, since it leads to narrowing the depth of focus. In addition, exposure wavelength has become shorter, and exposure apparatus using an ArF excimer laser having a wavelength of 193 nm as its light source has entered the stage of practical usage. However, new problems have occurred with such wavelength or light having a shorter wavelength; that they are greatly absorbed by air (oxygen), water vapor, hydrogen carbonate gas, or the like.

In addition, increasing the speed of the wafer stage or the reticle stage may cause the throughput or exposure accuracy to reduce. That is, increasing the speed of these stages leads to an increase in settling time for position setting, or an increase in synchronous settling time of both stages on scanning exposure. In addition, increasing the speed also increases vibration, which may aggravate the positional controllability of the stages.

Under such circumstances, a proposal of an exposure apparatus of a double stage type, which comprises two wafer stages, has recently been made in order to achieve improvement in throughput from a different perspective. With such an apparatus, an almost continuous exposure is possible by exposing a wafer on one wafer stage while performing wafer exchange or alignment on the other wafer stage, and then continuing the above operations with the stages switched. Thus, throughput is considered to increase drastically, with such an apparatus.

With the double wafer stage type exposure apparatus, however, the reaction force caused by the movement of the wafer stage where operations such as alignment is performed may be the cause of vibration in the other wafer stage where exposure is performed. This may lead to a decrease in exposure accuracy, which may reduce the yield of the end products, or the devices. Accordingly, from an overall perspective, productivity of the devices may not always be improved.

In addition, even if the double wafer stage method is employed, the problem of the transmittance of the exposure light decreasing due to absorption of the exposure light referred to earlier still remains. Also, if the double wafer stages are simply employed, the footprint will increase due to larger stage supporting beds. This will restrict the number of exposure apparatus units that can be arranged in a clean room in a semiconductor factory. Since the running cost of a clean room is extremely expensive, as a whole, the productivity of the devices may not always be improved.

SUMMARY OF THE INVENTION

The present invention was made under the circumstances above, and has as its object to provide an exposure apparatus and a substrate processing system that contributes to improving the productivity of devices, which are end products.

According to the first aspect of the present invention, there is provided a first exposure apparatus that transfers a pattern formed on a mask onto a substrate via a projection optical system, the exposure apparatus comprising: a mask stage that holds the mask; a substrate stage that holds the substrate; a first main body unit that supports at least one of the mask stage and the substrate stage; four first vibration isolators that support the first main body unit at four points and isolate vibration in the first main body unit; a second main body unit that supports the projection optical system; and three second vibration isolators that support the second main body unit at three points on different straight lines on the first main body unit and isolate vibration in the second main body unit.

With this apparatus, the first main body unit that supports at least either the mask stage holding the mask or the substrate stage holding the substrate is supported at four points by the four first vibration isolators, and the second main body unit holding the projection optical system at three points on different straight lines on the first main body unit by the three second vibration isolators. Therefore, fine vibration from the floor surface traveling to the first main body unit is suppressed by each of the first vibration isolators, while the vibration occurring due to the movement of the stage supported by the first main body unit is either suppressed or prevented from traveling to the second main body unit by each of the second vibration isolators. Accordingly, vibration occurring in the projection optical system held by the second main body unit can be effectively suppressed. In this case, since the apparatus comprises the vibration isolators arranged in series in two platforms, this shows a great effect of suppressing background vibration (fine vibration) from the floor surface, especially when the apparatus is easily influenced by the floor rigidity. In addition, since the second main body unit is supported on the first main body unit at three points by the three second vibration isolators, the second main body unit is likely to deform. Accordingly, vibration and tilt or the like in the projection optical system hardly occurs, and deterioration in the projection image due to these factors can be avoided almost without fail. In addition, since the first main body unit is supported at four points by the first vibration isolators, the first main body unit, or furthermore, the stage supported by the first main body unit can be supported in a stable manner with high rigidity. As a consequence, exposure with high precision becomes possible, which leads to an improvement in yield of devices serving as end products, and the productivity of the devices can be improved.

In this case, the four first vibration isolators can support the first main body unit at each corner of in a square shape. In such a case, when maintenance is performed on members arranged in the space between the four first vibration isolators (a part of the first main body unit, or a member supported by such part), the direction from which maintenance can be performed increases in at least one direction when compared with the case, for example, when the first main body unit is supported at three points. Accordingly, the degree of freedom and workability increases during maintenance-, which leads to a decrease in the time required for maintenance, or rather a reduction in the shutdown of the apparatus, that is, the operation rate of the apparatus can be improved. As a result, the productivity of the devices serving as end products can be improved.

With the first exposure apparatus of the present invention, each of the second vibration isolators can be an active vibration isolator that includes an actuator.

In this case, provided in the second main body unit can be at least one of an interferometer that measures a position of at least one of the stages, a position detector that measures at least a position of the substrate in an optical axis direction of the projection optical system and a tilt, and a mark detection system that detects a position of marks on the substrate, and a vibration sensor that detects vibration in the second main body unit, and the exposure apparatus can further comprise: a controller that performs posture control of the second main body unit by controlling the actuators based on an output of the vibration sensor.

In this case, the controller can perform the posture control in direction of three degrees of freedom, in the optical axis direction of the projection optical system and in rotational directions around two orthogonal axes within a plane perpendicular to the optical axis.

With the first exposure apparatus of the present invention, the second main body unit can support the projection optical system at three points via a kinematic support mechanism.

With the first exposure apparatus of the present invention, the first main body unit can hold the mask stage.

With the first exposure apparatus of the present invention, the exposure apparatus can have a first substrate stage that holds a first substrate and a second substrate stage that holds a second substrate serving as the substrate stage, and the first main body unit can hold the first substrate stage and the second substrate stage.

According to the second aspect of the present invention, there is provided a second exposure apparatus that transfers a pattern formed on a mask onto a substrate via a projection optical system, the exposure apparatus comprising: an optical system holding unit that holds the projection optical system; a stage chamber where a substrate chamber that houses a substrate stage holding the substrate is formed inside, along with a first opening in which members on an image plane side of the projection optical system can be inserted; and a first connecting member that connects a periphery portion of the first opening of the stage chamber to a circumferential portion of the projection optical system while isolating the inside of the substrate chamber from outside air in a sealed state, the first connecting member having flexibility.

With this apparatus, the first opening in which members on the image plane side of the projection optical system held by the optical system holding unit can be inserted is formed in the stage chamber where the substrate chamber housing the substrate stage that holds the substrate is formed inside. In addition, the first connecting member that has flexibility connects the periphery portion of the first opening of the stage chamber to the circumferential portion of the projection optical system while isolating the inside of the substrate chamber from the outside air in a sealed state. Accordingly, the projection optical system and the stage chamber can be connected in a simple method, as well as the inside of the projection optical system and the substrate chamber isolated from the outside air in a sealed state. With this arrangement, outside air and dust or the like can be prevented from entering the optical path of the illumination light for exposure from the projection optical system to the substrate, and the degree of cleanliness inside the sealed chamber (in some cases including the degree of chemical cleanliness) can be maintained. Accordingly, decrease in transmittance of the exposure light due to absorption of impurities by the illumination light for exposure can be suppressed, allowing exposure with high precision for a long period of time. In addition, vibration of the stage chamber due to the movement of the substrate stage is almost all absorbed by the extension/contraction, and deformation of the first connecting member, thus, it hardly affects the projection optical system held by the optical system holding unit. Accordingly, exposure with high precision (transfer of the mask pattern onto the substrate) is possible for over a long period of time, which improves the yield of devices serving as end products, which in turn, improves the productivity of the devices.

In this case, the first connecting member can be a flexible bellows.

With the second exposure apparatus of the present invention, the inside of the substrate chamber can be filled with at least one of an inert gas and nitrogen gas that absorbs only a small amount of an $F_2$ laser beam or an ArF laser beam.

With the second exposure apparatus of the present invention, a second opening can be further formed in the stage chamber, and the optical system holding unit can have a third opening formed at a position opposing the second opening and a holding member that holds the projection optical system, and the exposure apparatus can further comprise: a second connecting member that connects the stage chamber and the holding member in a sealed state isolated from outside air at a periphery portion of the second opening and the third opening opposing the second opening, the second connecting member having flexibility; a detection system that detects positional information on at least one of the substrate and marks on the substrate, the detection system having a barrel portion inserted in a space formed by the second opening, the third opening, and the second connecting member, and a sensor head portion divided from the barrel portion; and a glass plate that isolates the inside of the space from the outside air, the glass plate fixed to a surface of the holding member on the opposite side of the stage chamber.

In this case, the second connecting member can be a flexible bellows.

With the second exposure apparatus of the present invention, in the case the apparatus comprises a second opening, a third opening, and a glass plate that isolates the inside of the space formed by the second connecting member from the outside air, a seal member can seal the space between the glass plate and the holding member.

In this case, the seal member can be one of an O-ring and a viscous member that complies with chemically clean requirements.

With the second exposure apparatus of the present invention, the projection optical system can have a tilt drive portion including a tilt drivable lens located closest to an image plane side, and a fixed portion integrally fixed to the optical system holding unit, and the tilt drive portion and the fixed portion can be connected with a connecting member, the connecting member having flexibility.

In this case, the tilt portion can have the lens and a holding frame that holds the lens, and a seal member can seal the space between the lens and the holding frame.

In this case, the seal member can be one of an O-ring and a viscous member that complies with chemically clean requirements.

With the second exposure apparatus of the present invention, the exposure apparatus can further comprise a gas blowing portion that blows inert gas inside the substrate chamber within the stage chamber, the blowing portion detachably connected to the stage chamber.

With the second exposure apparatus of the present invention, the exposure apparatus can further comprise a supporting unit that supports the optical holding unit via a vibration isolator, whereby the supporting unit can support the stage chamber by suspension.

According to the third aspect of the present invention, there is provided a third exposure apparatus that transfers a pattern formed on a mask onto a substrate via a projection optical system, the exposure apparatus comprising: a stage chamber where members on an image plane side of the projection optical system are inserted and a sealed chamber that houses a substrate stage holding the substrate is formed inside; a first main body unit that supports the stage chamber by suspension; and reaction bars that absorb reaction force occurring when the substrate stage is driven, one end of the reaction bar being connected to the stage chamber.

With this apparatus, the first main body unit supports the stage chamber where members on the image plane side of the projection optical system are inserted and a sealed chamber that houses a substrate stage holding the substrate is formed inside. And, one end of the reaction bar that releases the reaction force when the substrate stage is driven to the floor surface is connected to the stage chamber. That is, the stage chamber is supported by suspension by the first main body unit, and furthermore, the reaction force occurring within the stage chamber with the movement of the substrate stage is almost entirely absorbed by the reaction bar. Accordingly, vibration hardly remains in the stage chamber, which suppresses vibration from traveling to the projection optical system via the stage chamber. That is, even if a part of the projection optical system is arranged within a sealed chamber, adverse effects on the exposure accuracy due to vibration can be reduced. As a result, the exposure accuracy can be improved, improving the yield of devices serving as end products, which in turn, can improve the productivity of the devices.

In this case, the exposure apparatus can further comprise a reaction frame fixed to a floor surface, the reaction frame being connected to the other end of the reaction bar. In such a case, even if vibration that could not be absorbed by the reaction bar remains, the vibration (residual vibration) is transferred (released) to the floor via the reaction frame.

With the third exposure apparatus of the present invention, the stage chamber can have a chamber main body that houses the substrate stage where an opening portion is formed on at least one side of a side surface of the chamber main body, and a cover that covers the opening portion, the cover protruding outside the chamber main body, and at least a part of an interferometer that measures a position of the substrate stage can be arranged in a space inside the cover.

In this case, a first substrate stage and a second substrate stage serving as the substrate stage can be housed within the chamber main body where the opening portion is formed on one side and the other side of a side surface of the chamber main body, respectively, the cover can be arranged in twosome corresponding to the two opening portions, and at least a part of two interferometers that individually measure positions of the first and the second substrate stages can be arranged, respectively, within each of the covers.

With the third exposure apparatus of the present invention, when at least a part of the interferometer that measures the position of the substrate stage is arranged in the space inside the cover, the exposure apparatus can further comprise: a second main body unit that holds the projection optical system, the second main body unit mounted on the first main body unit via a vibration isolator; and a sensor column that supports the second main body unit by suspension while holding at least the interferometers arranged inside the stage chamber, and a length of the sensor column in a direction perpendicular to the side surface of the chamber main body where the opening portion is formed, can be set larger than the chamber main body.

According to the fourth aspect of the present invention, there is provided a fourth exposure apparatus that transfers a pattern formed on a mask onto a substrate via a projection optical system, the exposure apparatus comprising: a stage chamber where a substrate chamber that houses a substrate stage holding the substrate is formed inside, along with a first opening in which members on an image plane side of the projection optical system can be inserted; and an optical system holding unit where a second opening is formed at a position opposing the first opening, the optical system holding unit having a holding member for holding the projection optical system; a connecting member that connects a periphery portion of the first opening of the stage chamber to the second opening of the holding member; a cover that covers a circumferential portion on an object surface side of the projection optical system, one end of the cover being connected to a surface of the holding member opposite to the stage chamber; a planar glass mounted on an opening edge surface of the cover via a double-structured O-ring; and an exhaust pipe that exhausts gas inside a ring-shaped space enclosed by the double structured O-ring, the planar glass, and the cover, the exhaust pipe being connected to the space via the cover.

With this apparatus, the connecting member, the holding member, and the planar glass form a space that is connected to the substrate chamber inside the stage chamber and encloses the projection optical system. In this case, if the inside of the projection optical system is purged with the same type of gas as the inside of the substrate chamber, the gas environment of the optical path of the illumination light for exposure from the projection optical system to the substrate can be the same. In addition, by creating a negative pressurized (vacuumed) state within the ring-shaped space, the planar glass is fixed to the cover. In this case, since the planar glass can be fixed to the cover without using screws or the like, deformation of the glass surface can be suppressed, suppressing the influence on the exposure accuracy. As a consequence, the exposure accuracy can be improved, which improves the yield of devices serving as products, which in turn improves the productivity of the devices.

According to the fifth aspect of the present invention, there is provided a substrate processing system that performs a predetermined process on a substrate, the substrate processing system comprising: an exposure apparatus comprising an exposure apparatus main body that forms a predetermined pattern on the substrate by exposure, the exposure apparatus main body having a stage chamber that houses a substrate stage holding the substrate and a main unit that detachably supports the stage chamber by suspension, and a total chamber that houses the exposure apparatus main body almost entirely; a substrate processor that performs at least one of resist coating and development on the substrate; and an interface section that connects the total chamber and the substrate processor inline, the interface section being freely detachable to the total chamber and the substrate processor, with a substrate carriage system housed inside.

With this system, the exposure apparatus structuring the substrate processing system comprises an exposure apparatus main body having a stage chamber that houses a substrate stage holding the substrate and a main unit that detachably supports the stage chamber by suspension, and a total chamber that houses the exposure apparatus main body almost entirely. In addition, the total chamber and the substrate processing system structuring the exposure apparatus is connected inline with an interface section which houses a substrate carriage system inside. This interface section is freely detachable. That is, during maintenance operations, the interface section located between the exposure apparatus and the substrate processing system can be moved, and the stage chamber can also be drawn out from the main body unit structuring the exposure apparatus main body within the total chamber into the space between the exposure apparatus and the substrate processing system. This allows maintenance operations within the stage chamber to be performed using the space in between the exposure apparatus and the substrate processing system. That is, for example, within a factory that has a plurality of substrate processing systems, maintenance operations on a substrate processing system can be performed without stopping the operations of adjacent substrate processors. By such operations, the productivity of the devices serving as end products can be improved.

In addition, in a lithographic process, by performing exposure using any one of the first to fourth exposure apparatus in the present invention, a pattern can be formed accurately on a substrate, which allows high integration microdevices to be produced with high yield. Accordingly, in the present invention, furthermore from another aspect, there is provided a device manufacturing method using any one of the first to fourth exposure apparatus in the present invention.

DESCRIPTION OF THE PREFERRED EMBODIMENTS

<<First Embodiment>>

Figure 1:
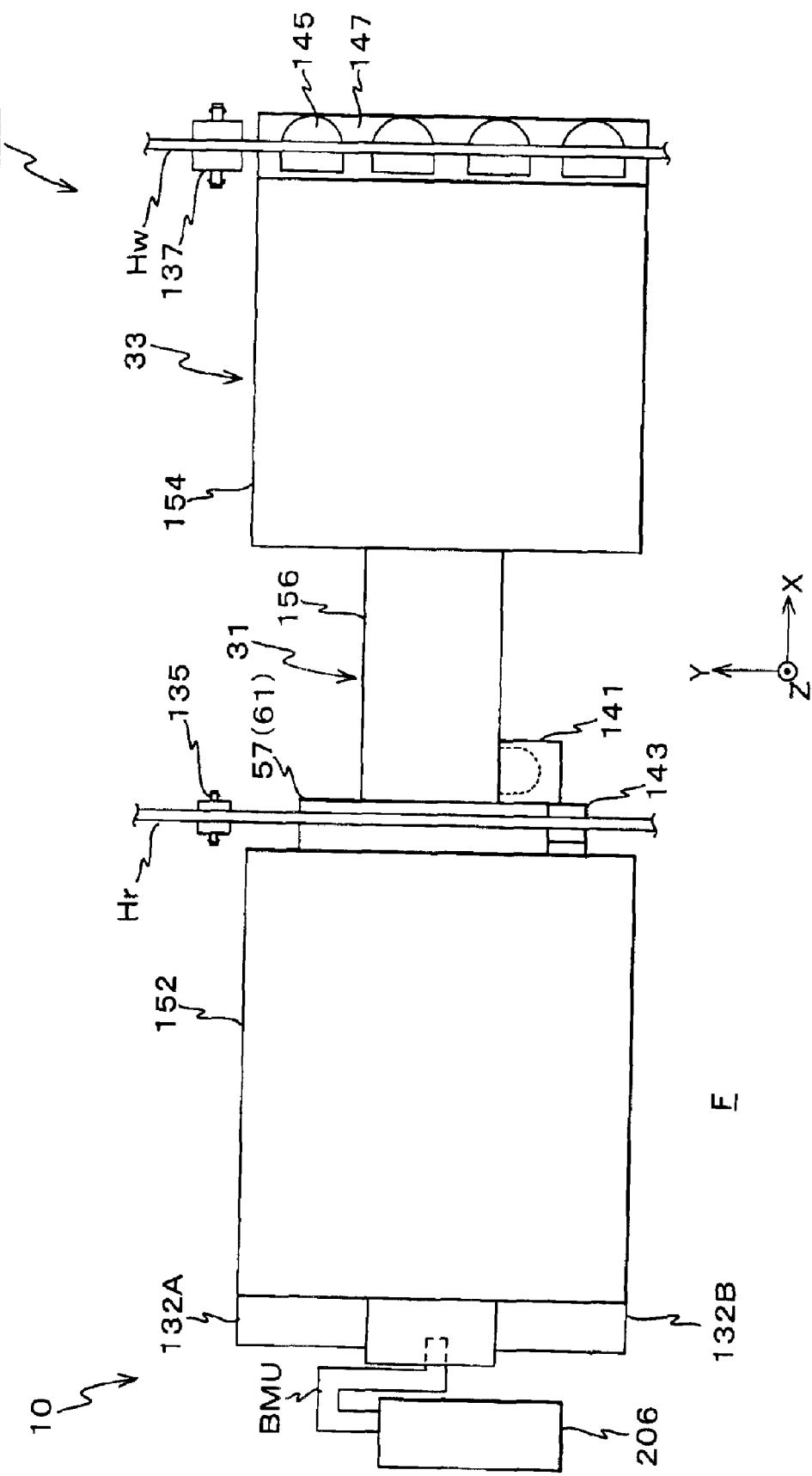
FIG. 1 is a planar view schematically showing a configuration of a substrate processing system of a first embodiment in the present invention.

Following is a description of a first embodiment related to the present invention, referring to FIGS. 1 to 16. FIG. 1 shows a planar view of an entire substrate processing system related to the first embodiment including an exposure apparatus related to the present invention.

A substrate processing system 200 shown in FIG. 1 is arranged in a clean room where the level of cleanliness is around class 100 to 1000. The substrate processing system 200 comprises: an exposure apparatus 10; a coater developer (hereinafter referred to as "C/D") 33 serving as a substrate processor; and an interface section 31 which connects exposure apparatus 10 and C/D 33 inline, arranged on a floor surface F of the clean room in an X-axis direction (the lateral direction on the page surface of FIG. 1) at a predetermined interval.

Inside exposure apparatus 10, it comprises: a main body chamber 152 serving as a total chamber that houses an exposure apparatus main body (to be described later); a light source 206 serving as a light source for exposure arranged at a predetermined interval on the floor surface F in the rear surface side (back surface) side of the main body chamber 152 (−X side); a reticle loader chamber 57 arranged adjacent to the front surface side of the main body chamber 152 (+X side); a wafer loader chamber 61 arranged below reticle loader chamber 57 adjacent to the front surface side of the main body chamber 152; helium gas supply devices 132A and 132B arranged adjacent to the −X side of main body chamber 152 along a Y-axis direction, on one end and the other end of the Y-axis direction, respectively; and a light guiding optical system connecting light source 206 and an illumination optical system making up the exposure apparatus main body, or the like. In the light guiding optical system, since an optical system for controlling the optical axis called a beam matching unit (BMU) is housed, the light guiding optical system will hereinafter be referred to as the "light guiding optical system BMU".

As light source 206, for example, a pulse laser light source is used, which emits a pulse ultraviolet light such as a KrF excimer laser (wavelength: 248 nm), an ArF excimer laser (wavelength: 193 nm), or an $F_2$ laser (wavelength: 157 nm). A light source controller (not shown) is connected to the light source so as to control the oscillation center wavelength and the spectral line width (half-bandwidth) of the emitted pulse ultraviolet beam, the trigger timing of the pulse oscillation, and the gases in the laser chamber, and the like.

Helium gas supply devices 132A and 132B supply clean helium gas, which is controlled at a predetermined target temperature, to a stage chamber (to be described later) via a helium gas supply piping (to be described later). In the embodiment, helium gas supply devices 132A and 132B and helium gas supply piping can easily be disconnected. The gas supplied to the stage chamber is not limited to helium gas, and an inert gas other than helium gas can be used. Nitrogen gas ($N_2$ gas) may also be used, which absorbs only a small amount of the $F_2$ laser beam and the ArF excimer laser beam.

In the embodiment, as is obvious from FIG. 1, light guiding optical system BMU is arranged on the floor. A large part of it, however, can be arranged below floor surface F, underneath the floor. Normally, the floor portion of the clean room is made up of a large number of pillars planted on the ground at a predetermined interval and meshed rectangular floor members arranged on the pillars in the shape of a matrix. Accordingly, the light guiding optical system BMU can be arranged easily under the floor, by removing a few of the floor members and the pillars underneath.

C/D 33 is used for coating a wafer with a resist serving as a photosensitive agent, as well as for developing a wafer that has been exposed. C/D 33 comprises: a chamber 154; a coater (resist coating system) and a developer (developing system) (both of them not shown) housed in chamber 154; and a wafer carriage system (not shown), and the like. On an opposite side of exposure apparatus 10 (+X side), a part of a lower edge portion sticks out, and a mount platform 147 is formed on the upper surface of the protruded portion for mounting a plurality of Front Opening Unified Pods (hereinafter referred to as "FOUP") 145, which is a type of a wafer carrier. On the ceiling portion of the clean room located almost above mount platform 147, a first guide rail Hw is arranged extending in the Y-axis direction. And along the first guide rail Hw, an OHV (Overhead Vehicle) 137, which 1 is an overhead carrier system, carries FOUP 145 with wafers housed. FOUP 145 is an open/close type container that houses a plurality of wafers vertically at a predetermined interval (a sealed type wafer cassette), similar to a carriage container disclosed in, for example, Japanese Patent Laid-open No. 08-279546.

In the embodiment, OHV 137 loads the FOUP 145 housing the wafers on mount platform 147, and also unloads the FOUP 145 from mount platform 147.

Interface section 31 comprises: a housing 156; and a wafer carriage system (not shown) housed in housing 156. The wafer carriage system carries wafers between C/D 33 and a wafer loader system (to be described later) arranged inside wafer loader chamber 61 connected to main body chamber 152. In addition, to housing 156 of interface section 31, a FOUP additional housing 141 is integrally attached, and on a side surface on the −Y side of FOUP additional housing 141, a FOUP additional port (not shown) is arranged. This arrangement allows an operator to carry a FOUP manually by measures such as PGV (Personnel Guided Vehicle) and to place it in the FOUP additional port, or to retrieve the FOUP. When a FOUP is set inside FOUP additional port 141, the wafer carriage system (not shown) inside housing 156 of interface section 31 takes out the wafers inside the FOUP, and loads them into the wafer loader system. Meanwhile, wafers that have been exposed are carried by the wafer carriage system via the wafer loader system, and then loaded into the FOUP as appropriate by the wafer carriage system. Wafers are taken in/out of the FOUP in a state where the inside of the FOUP is isolated from the outside air (refer to Japanese Patent Laid-open No. 08-279546).

In the embodiment, interface section 31 and FOUP additional port 141 are structured detachable (that is, easy to detach) to wafer loader chamber 61.

Figure 2:
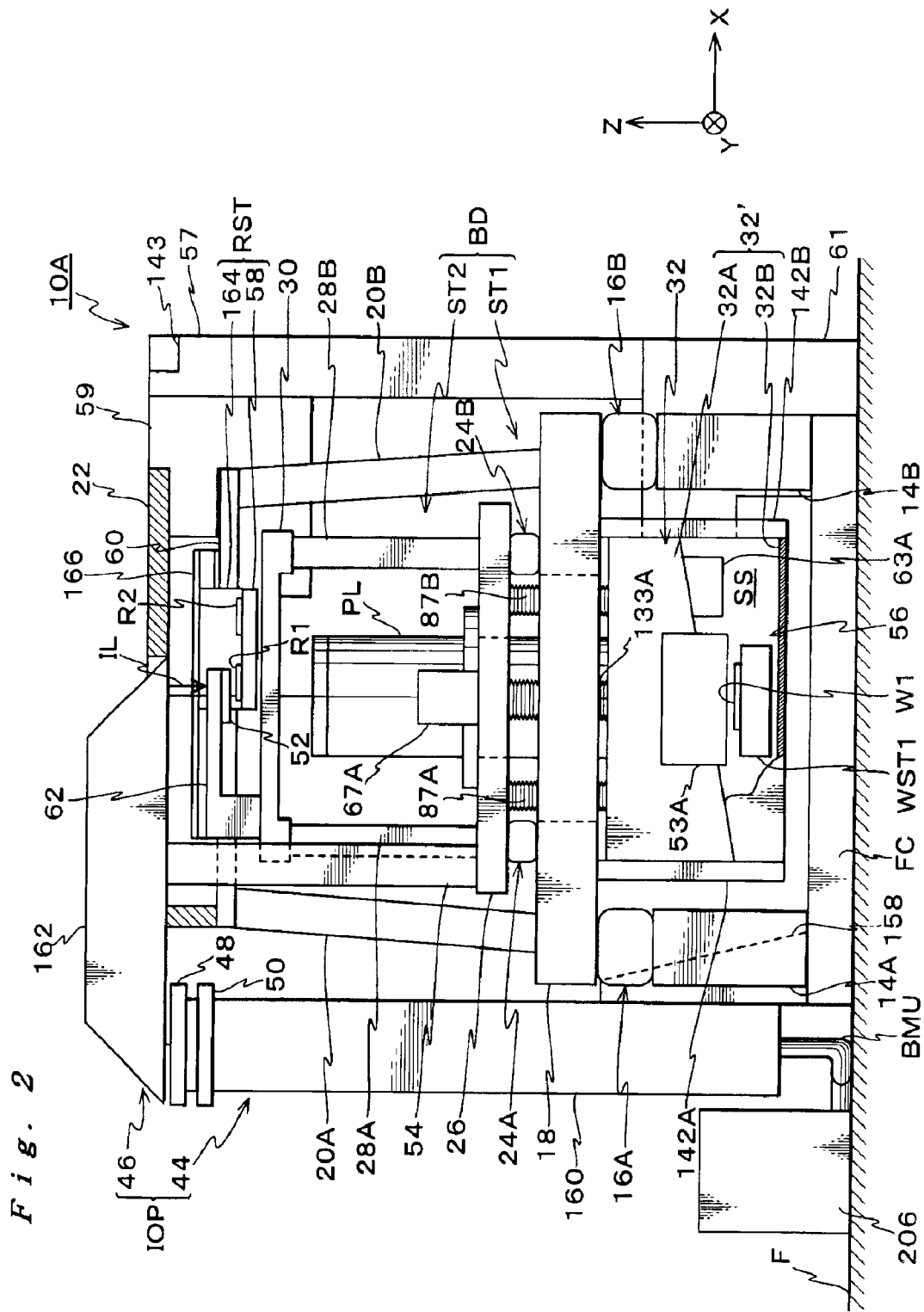
FIG. 2 is a view schematically showing the entire configuration of an exposure apparatus in FIG. 1.

FIG. 2 shows an entire structure of exposure apparatus 10 (exposure apparatus main body 10A, excluding main body chamber 152) in FIG. 1, schematically with a light source. Exposure apparatus main body 10A is a scanning exposure apparatus based on a step-and-scan method, that is, a so-called scanning stepper, which synchronously moves a reticle R1 (or reticle R2) serving as a mask and a wafer W1 (or wafer W2) serving as a substrate in a linear direction (in this case, it is to be an X-axis direction, which is the lateral direction on the page surface of FIG. 2), while transferring a circuit pattern formed on reticle R1 (or. R2) onto each shot area on wafer W1 (or W2) via a projection optical system PL.

Exposure apparatus main body 10A comprises parts such as: an illumination optical system IOP which illuminates reticle R with illumination light from light source 206; a reticle stage RST serving as a mask stage which holds reticle R1 and R2; projection optical system PL which projects illumination light outgoing from reticle R onto wafer W1 and W2; wafer stages WST1 and WST2 serving as a substrate stage which holds wafer W1 and W2, respectively (however, wafer stage WST2 is not shown in FIG. 2, refer to other drawings such as FIG. 4); and a main body column BD which movably supports reticle stage RST, wafer stage WST1, and wafer stage WST2, and also holds projection optical system PL.

Illumination optical system IOP comprises: a first illumination unit 44 supported by an illumination system support portion 158, which has a predetermined length extending in a Z-axis direction (vertical direction) and is fixed on an upper surface on the −X side of a frame caster FC serving as a base member arranged on floor surface; and a second illumination unit 46 arranged almost horizontally above the first illumination unit 44.

The first illumination unit 44 comprises: a first illumination housing 160; and a first partial illumination system made up of a beam shaping optical system, an optical integrator (a uniformizer or a homogenizer) for uniform illuminance distribution, a light-amount monitor, a variable aperture stop, a relay lens system, and the like (all of them not shown), arranged in a predetermined positional relationship in the first illumination housing 160. An emitting surface of the first partial illumination system is arranged almost conjugate to a pattern surface of reticle R1 or reticle R2 (hereinafter also referred to as "reticle surface" as appropriate)(hereinafter also generally referred to as "reticle R" as appropriate). On the emitting surface, a movable reticle blind 48 serving as a movable field stop is arranged, and on a surface in the vicinity of movable reticle blind 48 on an incident surface side (a surface slightly defocused from the surface conjugate to the reticle surface), an illuminance distribution correction filter 50 is arranged to correct the illuminance distribution in an illumination area.

The state of movable reticle blind 48 is controlled by a main controller (not shown) at the beginning and end of scanning exposure on each shot area on the wafer. By further restricting the illumination area, irradiation on unnecessary areas other than a pattern area where the circuit pattern is formed with the illumination light (exposure light) can be prevented. In addition, the main controller (not shown) controls movable reticle blind 48 so that the width of an illumination field in the non-scanning direction corresponds to the width of the circuit pattern subject to exposure in the non-scanning direction prior to scanning exposure.

The second illumination unit 46 comprises: a second illumination housing 162; and a second partial illumination system made up of a relay lens system, an optical path deflection mirror, a condenser lens system, and the like, arranged in a predetermined positional relationship in the second illumination housing 162. The second illumination unit 46 is supported by an illumination system support member 54, which extends in the vertical direction fixed to an upper surface of a projection optical system support member 26 (to be described later) structuring main body column BD.

The first and second illumination system housings 160 and 162 making up the first and second illumination units 44 and 46, respectively, are filled with clean dry nitrogen gas ($N_2$) or helium gas (He) that has a concentration of air (oxygen) under several ppm, preferably less than 1 ppm.

In the embodiment, as is shown in FIG. 2, a fixed reticle blind 52 serving as a fixed field stop is fixed to a bottom surface of a reticle alignment portion 62 where a reticle alignment microscope (not shown) used for aligning reticles R1 and R2 is arranged. That is, fixed reticle blind 52 is arranged on a surface slightly above reticles R1 and R2, in other words, on a surface defocused from the reticle surface by a predetermined amount. Fixed reticle blind 52 has an opening formed which sets the illumination area on the reticle surface in a narrow slit shape extending in the non-scanning direction, which is perpendicular to the scanning direction. Incidentally, fixed reticle blind 52 may also be arranged in the vicinity of the surface conjugate to the reticle surface, for example, on a surface close to where movable reticle blind 48 is arranged.

The operation of the illumination system made up of light source 206, illumination optical system IOP, and fixed reticle blind 52 referred to above will be briefly described below. The laser beam emitted from light source 206 enters the first illumination unit 44 via light guiding optical system BMU. When the laser beam passes through the first partial illumination optical system inside the first illumination unit 44, its sectional shape is shaped and becomes an illumination light (exposure light) IL that has a uniform illuminance distribution, and passes through the opening of movable reticle blind 48. Illumination light IL, which has passed through movable reticle blind 46, then enters the second illumination unit 46, passes through the second partial illumination optical system inside the second illumination unit 46 and illuminates fixed reticle blind 52 with an almost uniform illuminance distribution. Illumination light IL that has passed the opening of fixed reticle blind 52 then illuminates an illumination area on reticle R set by fixed reticle blind 52, with an almost uniform illuminance.

Reticle stage RST is supported by floatation on an upper surface of a reticle stage base 30 (to be described later), which structures main body column BD via a non-contact bearing, such as a pneumatic hydrostatic bearing. Reticle stage RST comprises: a reticle fine movement stage 58, which holds the two reticles R1 and R2 by vacuum chucking or the like; and a reticle coarse movement stage 164, which moves integrally with reticle fine movement stage 58 in the X-axis direction serving as the scanning direction with predetermined strokes.

Reticle fine movement stage 58 has two rectangular shaped openings (not shown) formed along the X-axis direction serving as the scanning direction, and in the periphery of the openings a reticle suction mechanism (not shown) is provided to hold the two reticles, R1 and R2 by vacuum chucking or the like.

In reticle coarse movement stage 164, electromagnets are provided so as to generate an upward magnetic suction force between a metal plate provided along with reticle fine movement stage 58, to draw reticle fine movement stage 58 upward. On a part of reticle coarse movement stage 164, movers (not shown) making up a reticle coarse movement mechanism are provided. When the movers are driven along stators 166 in FIG. 2 by a Lorentz force or the like, reticle coarse movement stage 164 moves in the X-axis direction at a predetermined velocity. In this case, reticle coarse movement stage 164 is driven in the X-axis direction holding reticle fine movement stage 58 in a non-contact manner.

In actual, a fine movement mechanism (not shown) is arranged in reticle fine movement stage 58 and reticle coarse movement stage 164, for finely moving reticle fine movement stage 58. The fine movement mechanism, for example, is made up of a metal plate provided in reticle fine movement stage 58 that has a broad surface parallel to an YZ plane perpendicular to the X-axis direction and two coils arranged on reticle coarse movement stage 164 so as to clamp the metal plate from both sides in the X-axis direction. And, by providing different currents (or in other words, changing the magnetic suction force) to the two coils, the reticle fine movement stage can be finely driven in the X-axis direction. This allows improvement in synchronous accuracy of reticle R.

On reticle stage base 30, a laser interferometer (not shown) is arranged to measure a two-dimensional position and a rotational angle of reticle fine movement stage 58, and also its position in the X-axis direction with high accuracy. And, the position and velocity of reticle fine movement stage 58 are controlled based on the measurement results.

In addition, although it is not shown, a counter mass, which moves in the direction opposite to reticle coarse movement stage 164 along the X-axis direction, is arranged on a reticle coarse movement stage base 60 shown in FIG. 2 in order to cancel reaction force generated when driving reticle coarse movement stage 164.

In the embodiment, two reticles R1 and R2 are held adjacent along the scanning direction based on a double holder method on reticle fine movement stage 58. Therefore, operations such as double exposure can be efficiently performed. In addition, as is described above, since reticle fine movement stage 58 is drawn above due to the magnetic suction force of reticle coarse movement stage 164, the weight of reticle fine movement stage 58 is hardly on reticle fine movement stage base 30 and only a slight force from the non-contact bearing arranged in reticle fine movement stage 58 is put on reticle fine movement stage base 30. For such reasons, reticle fine movement stage base 30 hardly deforms.

Reticle stage RST is not limited to the one described above in the embodiment based on the double holder method, and other types such as a double reticle stage may be used on which two reticles are separately mounted on independent movable stages. Or, furthermore, a single reticle stage based on a single holder method that uses a single reticle may be used.

As projection optical system PL, for example, a refraction optical system that is double telecentric on both the object surface side (reticle side) and the image surface side (wafer W side), having a reduction magnification of ¼ (or ⅕) is used. Therefore, when illumination light IL, which is pulse ultraviolet light emitted from illumination optical system IOP, is irradiated on the reticle R1 (or R2), the imaging beam emitted from the portion irradiated by the pulse ultraviolet light of the circuit pattern area on the reticle R1 (or R2) enters the projection optical system PL, forming a partial inverted image of the circuit pattern in the center of a circular field on the image surface side of the projection optical system PL which is limited in a slit shape or a rectangular shape (polygon) per each irradiation of the pulse ultraviolet light. With this operation, the partial inverted image of the circuit pattern projected is reduced and transferred onto a resist layer applied on the surface of a shot area among a plurality of shot areas on the wafer W1 (or wafer W2) arranged at the image forming surface of the projection optical system PL.

With projection optical system PL, when an ArF excimer laser is used as the light source, a refraction optical system structured of only refraction optical elements (lens elements) is mainly used. In the case, however, an $F_2$ laser or the like is used as the light source, a so-called catadioptric system (a reflection refraction optical system), which is a combination of refraction optical elements and reflection optical elements (such as a concave mirror or a beam splitter), or a reflection optical system made up of only reflection optical elements, are mainly used. The details of such optical system are disclosed, for example, in Japanese Patent Laid-open No. 03-282527, Japanese Patent Laid-open No. 08-171054 and its corresponding U.S. Pat. No. 5,668,672, and Japanese Patent Laid-open No. 10-20195 and its corresponding U.S. Pat. No. 5,835,275. As long as the national laws in designated states or elected states, to which this international application is applied, permit, the disclosures cited above are fully incorporated herein by reference. When $F_2$ laser, however, is used as the light source, it is possible to use a refraction system.

In addition, the material of the lenses (glass material) structuring projection optical system PL also needs to differ depending on the light source. When an ArF excimer light source or a KrF excimer light source is used, both synthetic quartz and fluorite may be used for the lenses, however, when a light source in the vacuum ultraviolet region such as an $F_2$ laser light source is used, all the lenses must be made of fluorite.

Figure 4:
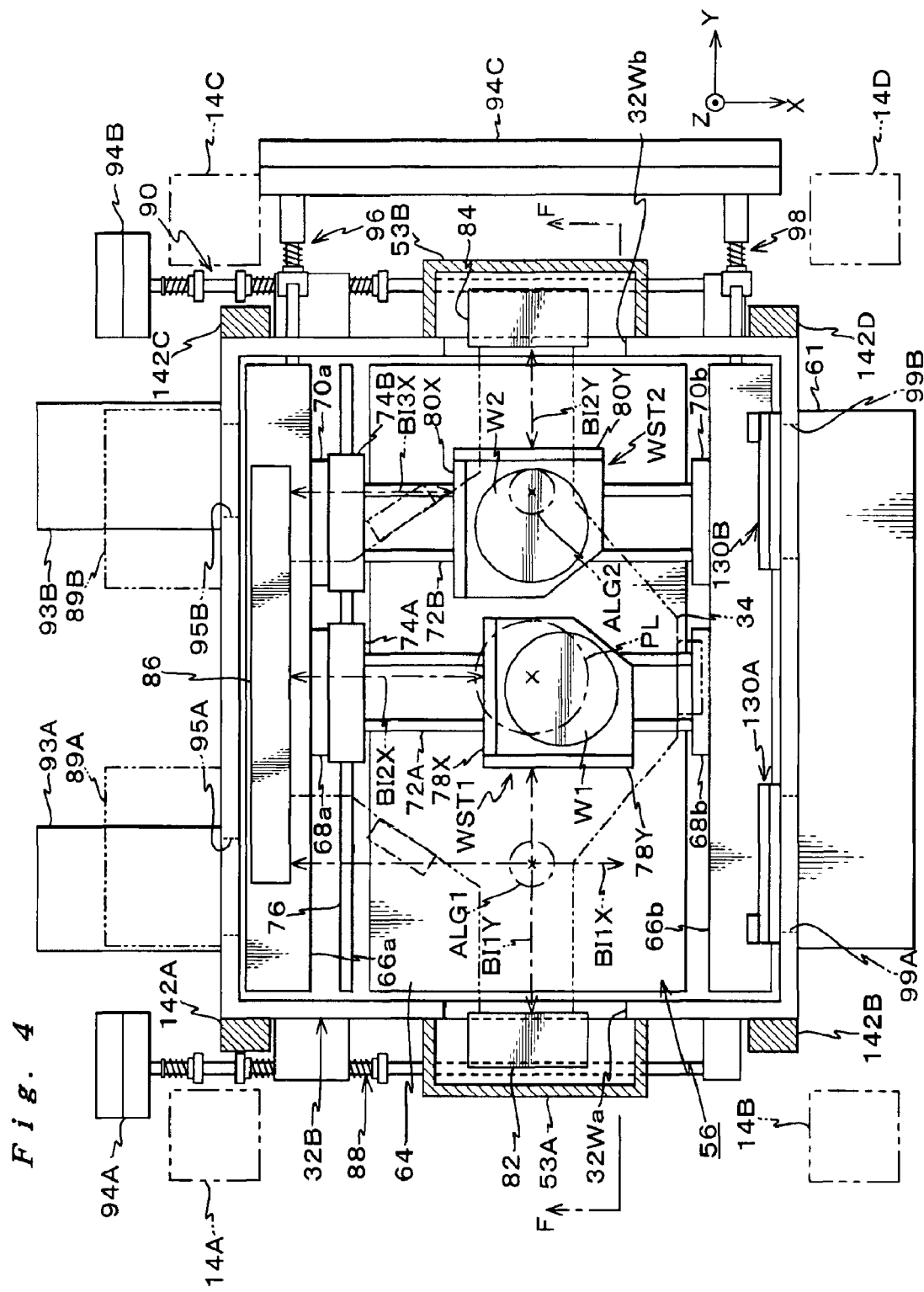
FIG. 4 is a planar view showing an inside of a lower chamber.

Wafer stages WST1 and WST2 (wafer stage WST2 in the depth of the page surface is not shown in FIG. 2, refer to FIG. 4) are arranged inside a stage chamber 32, which is supported by suspension, by a first frame ST1 structuring main body column BD. Wafer stages WST1 and WST2 each move continuously in the X-axis direction, by for example, liner motors, as well as move in stepping operations in the X-axis direction and the Y-axis direction. Furthermore, inside wafer stage WST1, a specimen support (not shown) is incorporated so as to finely drive wafer W1 in three degrees of freedom, in the Z-axis direction, a θx direction (rotational direction around the X-axis), and a θy direction (rotational direction around the Y-axis), and to perform leveling and focusing of wafer W1. Similarly, in the inside of wafer stage WST2, a specimen support (not shown) is incorporated so as to finely drive wafer W2 in three degrees of freedom, in the Z-axis direction, a θx direction (rotational direction around the X-axis), and a θy direction (rotational direction around the Y-axis), and to perform leveling and focusing of wafer W2. Details on wafer stages WST1 and WST2 and their drive systems are to be referred to later in the description.

With exposure apparatus 10 in the embodiment, the pattern image within the illumination area of reticle R1 (or R2) is projected on the surface of wafer W1 (or W2) coated with a resist, on the slit-shaped exposure area (an area conjugate to the illumination area) via projection optical system PL by a β projection magnification (β is magnification such as ¼ times or ⅕ times), with illumination light IL. And, in this state, by moving reticle R1 (or R2) and wafer W1 (or W2) synchronously in a predetermined scanning direction (the X-axis direction), the pattern of reticle R1 (or R2) is transferred onto the shot area on wafer W1 (or W2).

Following is a description of main body column BD. Main body BD comprises: the first frame ST1 serving as a first main body, which is supported at four points, respectively, via first vibration isolators 16A, 16B, 16C, and 16D (first vibration isolators 16C and 16D arranged in the depth of FIG. 2 are not shown, refer to FIG. 3) arranged on four first struts 14A, 14B, 14C, and 14D (first struts 14C and 14D arranged in the depth of FIG. 2 are not shown, refer to FIG. 3) that extend at a predetermined length in the vertical direction on four corners on the upper surface of the rectangular plate shaped frame caster FC, which is arranged horizontally on the floor surface F of the clean room; a second frame ST2 serving as an optical holder supported at three points by second vibration isolators 24A, 24B, and 24C (second vibration isolator 24C arranged in the depth of FIG. 2 is not shown, refer to FIG. 3) arranged on top of the first frame ST1; and the like.

As is shown in FIG. 2, the first frame ST1 is a frame structure which side view is almost an isosceles trapezoidal shape. The first frame ST1 comprises: a base frame 18, which has a rectangular-plate shape and makes up the bottom plate portion of the first frame ST1; two second struts 20A and 20B having one end fixed, respectively, on the four corner portions of the upper surface of base frame 18 and the other end each extending upward with an inward slant; and reticle coarse movement stage base 60, which has a rectangular plate shape and is supported almost horizontally with the other end of the two second struts 20A and 20B which are each connected to the bottom surface of reticle coarse movement stage base 60.

Figure 3:
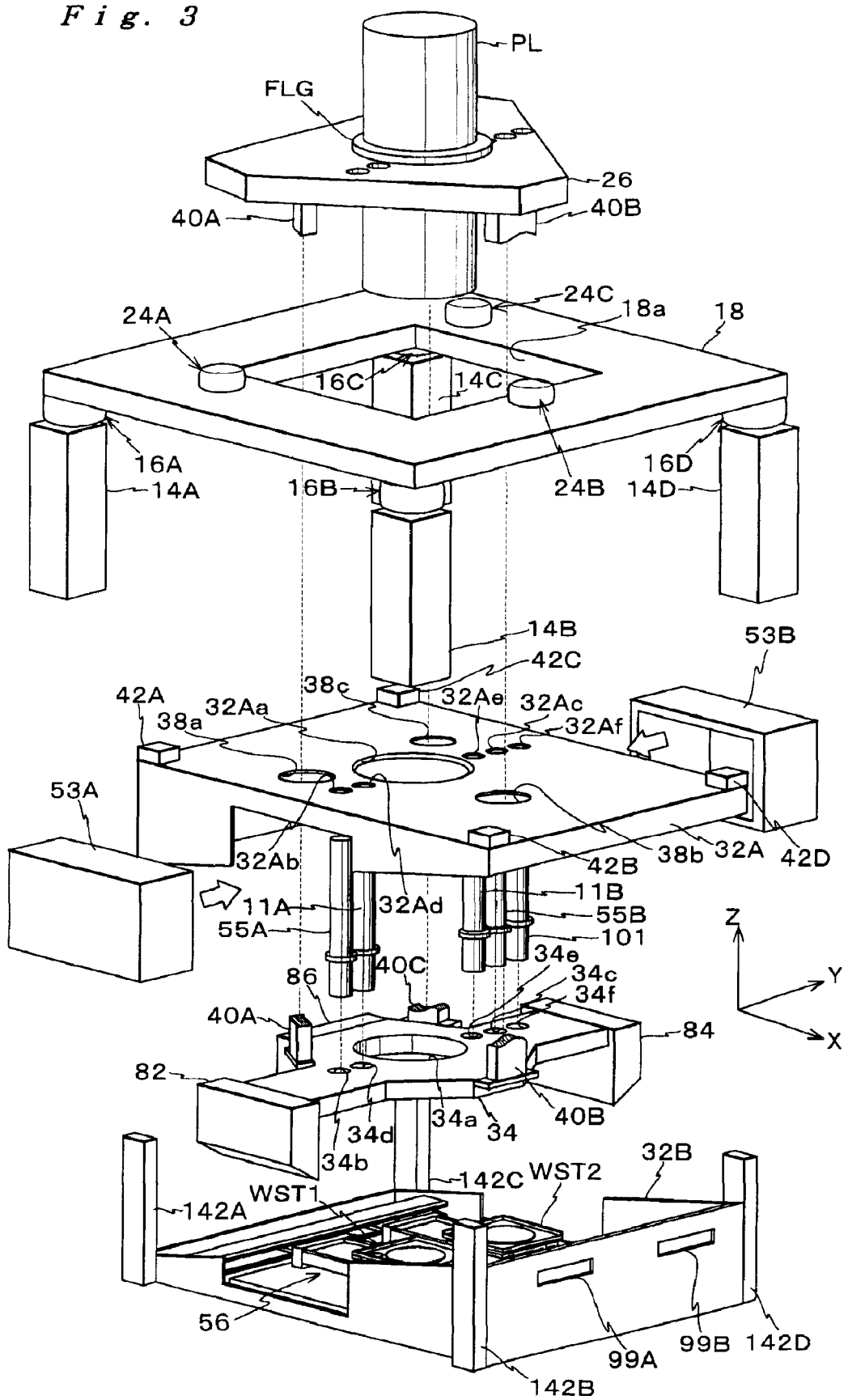
FIG. 3 is an exploded perspective view showing a lower halt portion of a projection optical system of the exposure apparatus in FIG. 2 in a disassembled state.

As is shown in FIG. 3, base frame 1B is made of a rectangular frame-shaped plate member that has a rectangular opening 18a formed in the center. The areas close to the four corners of the bottom surface of base frame 18 are supported almost horizontally with the first vibration isolators 16A to 16D. The first vibration isolators 16A to 16D are structured with parts including mechanical dampers that endure heavy weight such as air dampers or oil pressure controlled dampers arranged in series (or in parallel) on the upper end of the first struts 14A to 14D, respectively, and electromagnetic dampers made up of electromagnetic actuators such as voice coil motors. A displacement sensor detects a tilt angle to the horizontal surface on the upper surface of baser frame 18, and based on the detection values of the displacement sensor the main controller (not shown) drives the electromagnetic dampers that structure the first vibration isolators 16A to 16D so that the tilt angle is within a permissible range, and controls the air pressure or the oil pressure of the mechanical dampers when necessary. In this case, the mechanical dampers attenuate vibration from the floor that has a high frequency before it reaches the exposure apparatus main body including base frame 18, and the electromagnetic dampers attenuate residual vibration that has a low frequency. As the displacement sensor, for example, an electric level or an optical inclination detector or the like attached to base frame 18 can be used.

In FIG. 3, the mechanical dampers making up the first vibration isolators 16A to 16D are indicated as the first vibration isolators, 16A to 16D. Details on an active vibration isolation system that include the first vibration isolators, 16A to 16D, will be described further later in the description.

Reticle coarse movement stage base 60 is structured of a rectangular shaped plate member in a planar view, and on its upper surface stators 166 are arranged so as to drive the reticle fine movement stage in the X-axis direction, which is the scanning direction. In addition, on the upper surface side of the reticle coarse movement stage base 60, a partition wall 22 is arranged so as to form a reticle chamber covering the entire reticle stage RST. And, to an opening formed on a part of an upper end of partition wall 22, the second illumination unit 46 that structures illumination optical system IOP is connected in close contact.

The second frame ST2 comprises: projection optical system support member (barrel supporting bed) 26 serving as a holding member supported at three points by the second vibration isolators 24A, 24B, and 24C (refer to FIG. 3) that are fixed on the upper surface of base frame 18; three third struts 28A, 28B, and 28C (third strut 28C arranged in the depth of FIG. 2 is not shown, refer to FIG. 3) which are extending at a predetermined length in the vertical direction on the upper surface of projection optical system support member 26, fixed at positions facing the second vibration isolators 24A, 24B, and 24C, respectively; and reticle fine movement stage base 30 which is supported almost horizontally with the three third struts 28A to 28C.

Figure 9:
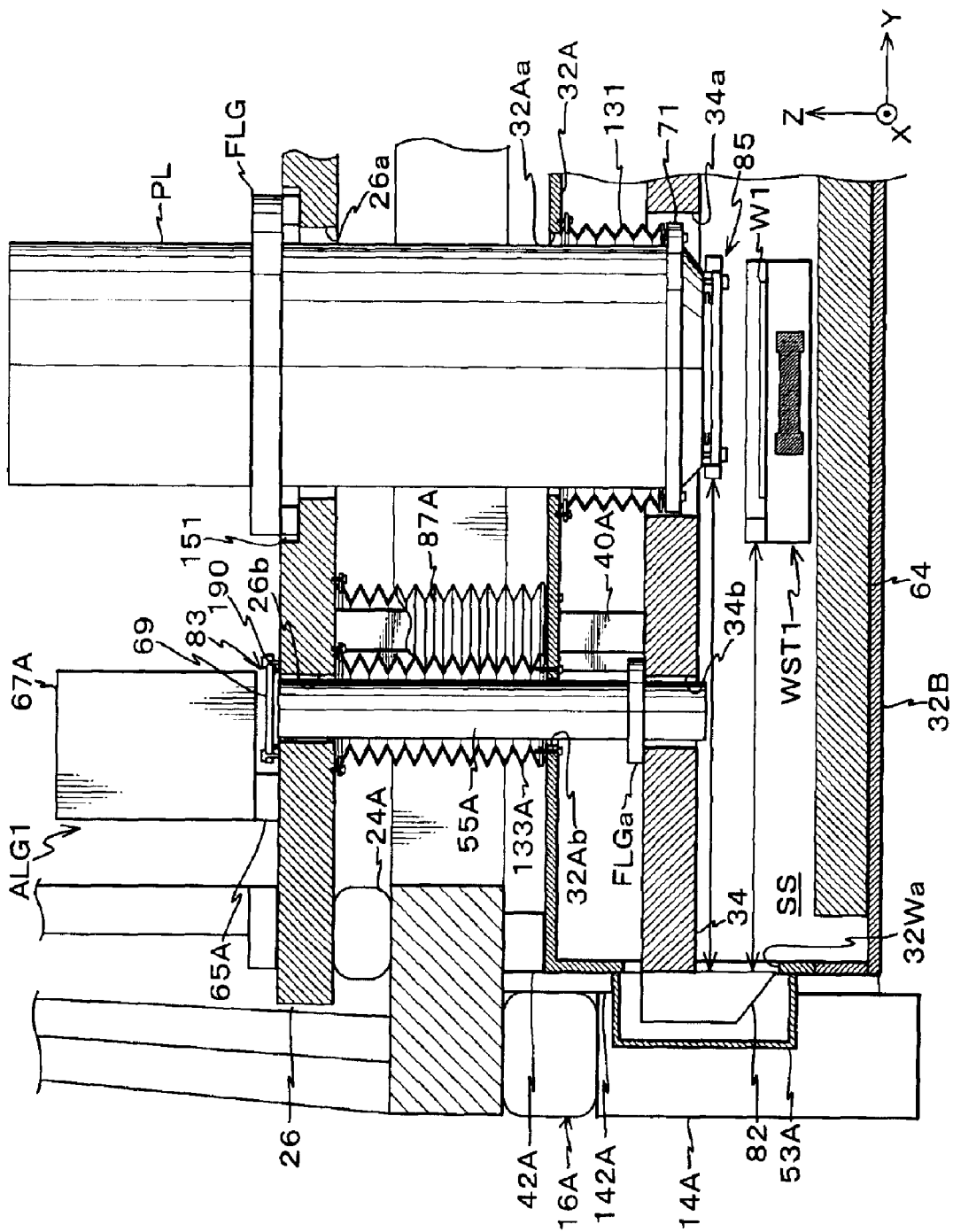
FIG. 9 is a sectional view schematically showing a neighboring area of a space within the stage chamber.

As it can be seen from FIG. 3, projection optical system support member 26 is structured of a plate member having a rough triangular shape in a planar view (when viewed from above). And, in its center, a stepped opening 26a (refer to FIG. 9) having a circular shape in a planar view (when viewed from above) is formed. As is shown in FIG. 9, projection optical system PL is inserted from above in stepped opening 26a, and projection optical system PL is supported by projection optical system support member 26 via a flange FLG arranged on the barrel portion of the projection optical system. In actual, three support members 151 are arranged on the lower portion of flange FLG so as to support projection optical system PL at three points.

In this case, a kinematic supporting mechanism may be formed in order to easily incorporate projection optical system PL to projection optical system support member 26, and to effectively reduce stress due to vibration, temperature change, posture change, and the like. In a kinematic supporting mechanism, a predetermined processing is performed on each of the support members 151 so that projection optical system PL may be supported at three points, by point, V groove, and surface.

In addition, as it can be seen from FIG. 3, the second vibration isolators 24A, 24B, and 24C, which are arranged on base frame 18, support the bottom surface close to the three tips of the triangle, respectively. The second vibration isolators 24A, 24B, and 24C are each structured similar to the first vibration isolators 16A to 16D (however, the load bearing is set lower than the first vibration isolators 0.16A to 16D). The angle of inclination of the upper surface of projection optical system support member 26 or the upper surface of reticle fine movement stage base 30 to the horizontal surface is then detected by a displacement sensor (not shown). And based on the detection values of the displacement sensor, a controller (not shown in FIG. 3, refer to FIG. 14) controls the movement of the three second vibration isolators 24A to 24C, so that the angle of inclination is within a permissible range. As the displacement sensors, for example, an electric level or an optical inclination detector or the like can be used, attached to projection optical system support member 26 or reticle fine movement stage base 30.

Referring back to FIG. 2, reticle fine movement stage base 30 is structured of a rectangular shaped plate member in a planar view (when viewed from above). The upper surface of reticle fine movement stage base 30 is processed into a guide surface with an extremely good level of flatness, and an opening is formed in the center (not shown) for the illumination light to passes through.

On the lower surface of base frame 18, stage chamber 32 is attached in a suspended state. Inside stage chamber 32, wafer stage WST1, wafer stage WST2, and a wafer stage device 56 (to be referred to later) which has a structure including the drive systems of these stages, are housed.

Stage chamber 32 comprises: a stage chamber main body 32' serving as a chamber main body with a rough cuboid shape; and covers 53A and 53B (cover 53B arranged on the +Y side is not-shown in FIG. 2, refer to FIG. 3) arranged on a surface on the ±Y side of stage chamber main body 32'. As is shown in FIG. 2, stage chamber main body 32' is divided into-two parts at a boarder surface, which is tilted at a predetermined angle to the horizontal surface around the center in the vertical direction. The upper half portion is an upper chamber 32A, and the lower half portion is a lower chamber 32B; in other words, stage chamber main body 32' is structured by combining upper chamber 32A and lower chamber 32B.

As is shown in FIG. 3, on the four corners of the ceiling of the upper chamber 32A, fixed portions 42A to 42D each having a cuboid shape are arranged. And, by fixing fixed portions 42A to 42D such as by screw to base frame 18, upper chamber 32A is fixed to the lower surface of base frame 18. In addition, suspension support members 142A to 142D are fixed such as by screw on the outside of the side surface of lower chamber 32B. Suspension support members 142A to 142D are fixed such as by screw to the lower surface of base frame 18, and the lower chamber 32B is also attached to the upper chamber 32A via a fastening mechanism (not shown). Thus, stage chamber 32 is attached to base frame 18 in a suspended state. It is also possible to fix the lower end portion of suspension support members 142A to 142D inside the bottom surface of lower chamber 32B, form openings in upper chamber 32A, make the upper end portion of suspension support members 142A to 142D project from the upper surface of the upper chamber, and fix the upper end portion to base frame 18.

In the side walls of upper chamber 32A and lower chamber 32B on both ends in the Y-axis direction, notches are formed, respectively, in the shapes shown in FIG. 3.

In a state where upper chamber 32A and lower chamber 32B are combined, as in FIG. 2, window portions 32W$a$ and 32W$b$ (refer to FIG. 4) that have rectangular openings are respectively formed in the side walls on both ends in the Y-axis direction. In addition, covers 53A and 53B (cover 53B arranged in the depth of the page surface is not shown in FIG. 2, refer to FIG. 4) having a box shape with an opening in one surface are attached to the side walls of stage chamber main body 32' that are located on both ends in the Y-axis direction. Covers 53A and 53B enclose the window portions 32W$a$ and 32W$b$, and are attached to the side walls via a seal member such as a gasket (not shown).

Wafer stage device 56 is arranged inside lower chamber 32B. Details on wafer stage device 56 will be described below referring to FIG. 4, which is a planar view of lower chamber 32 and its neighboring members.

As is shown in FIG. 4, wafer stage device 56 comprises: a stage base 64 arranged horizontally on the bottom surface inside lower chamber 32B; two wafer stages WST1 and WST2 that are supported by floatation above the upper surface of stage base 64 via a non-contact bearing, such as a pneumatic hydrostatic bearing, and are capable of moving independently in two dimensional directions, in the Y-axis direction (lateral direction of the page surface in FIG. 4) and in the X-axis direction (vertical direction of the page surface in FIG. 4); stage drive systems for driving the wafer stages WST1 and WST2, respectively; and the like.

More particularly, a plurality of pneumatic hydrostatic bearings (not shown) are arranged on the bottom surface of wafer stages WST1 and WST2, and by these pneumatic hydrostatic bearings wafer stages WST1 and WST2 are supported by floatation above the upper surface of stage base 64 maintaining, for example, a clearance of around several $\mu$m.

On one side and the other side in the X-axis direction of stage base 64 inside lower chamber 32B, Y-axis linear guides (made up of, for example, magnetic pole units incorporating permanent magnets) 66$a$ and 66$b$ that extend in the Y-axis direction and have a sectional shape of the letter U, respectively, are arranged. In the space inside the Y-axis linear guides, for example, Y-axis movers that have two movers each; 68$a$ and 70$a$, and 68$b$ and 70$b$, which are made up of armature coils incorporating armature units, are arranged opposing each other in a non contact manner. The Y-axis movers are capable of moving along the Y-axis direction due to the Lorentz force generated between Y-axis linear guides 66$a$ and 66$b$. That is, in the embodiment, moving coil type Y-axis linear motors are structured, respectively, with Y-axis movers 68$a$ and 70$a$ made up of armature units and Y-axis linear guide 66$a$. Likewise, moving coil type Y-axis linear motors are structured, respectively, with Y-axis movers 68$b$ and 70$b$ made up of armature units and Y-axis linear guide 66$b$. Hereinafter, the four Y-axis linear motors above will each be referred to using the same reference numerals as the Y-axis movers 68$a$, 68$b$, 70$a$, and 70$b$ that structure the respective movers, and will be referred to as Y-axis linear motor 68$a$, Y-axis linear motor 68$b$, Y-axis linear motor 70$a$, and Y-axis linear motor 70$b$, as appropriate.

Y-axis mover 68$a$ is fixed to one end (the −X side) of an X-axis linear guide (made up of, for example, armature units incorporating armature coils) 72A in the longitudinal direction via a slider 74A, which extends in a predetermined length in the Y-axis direction. On the other end (the +X side) of X-axis linear guide 72A in the longitudinal directions Y-axis mover 68$b$ is fixed. Similarly, Y-axis mover 70$a$ is fixed to one end (the −X side) of an X-axis linear guide (made up of, for example, armature units incorporating armature coils) 72B in the longitudinal direction via a slider 74B, which extends in a predetermined length in the Y-axis direction. And, on the other end (the +X side) of X-axis linear guide 72B in the longitudinal direction, Y-axis mover 70$b$ is fixed.

Sliders 74A and 74B are supported by pneumatic hydrostatic bearings (not shown) in a non contact manner maintaining a predetermined clearance to surfaces of guide 76, which is arranged extending in the Y-axis direction on the upper surface of stage base 64; on both sides in the X-axis direction, and also its upper surface (the surface on the +Z side). In this case, guide 76 has a role of a yaw guide to prevent $\theta z$ rotation (yawing) from occurring in X-axis linear guides 72A and 72B. Accordingly, the pairs of Y-linear motors 68$a$ and 68$b$, and 70$a$ and 70$b$, each accurately drive X-axis linear guides 72A and 72B along the Y-axis, respectively.

On a bottom portion of one of the wafer stages, WST1, a magnetic pole unit (not shown) having a permanent magnet is arranged. This magnetic pole unit, and one of the X-axis linear guide 72A make up a moving magnet type X-axis linear motor that drives wafer stage WST1 in the X-axis direction. In addition, on a bottom portion of the other wafer stage, WST2, a magnetic pole unit (not shown) having a permanent magnet is arranged. This magnetic pole unit, and the other X-axis linear guide 72B make up a moving magnet type X-axis linear motor that drives wafer stage WST2 in the X-axis direction. Hereinafter, these X-axis linear motors will be referred to using the same reference numerals as the linear guides 72A and 72B that structure the respective stators, and will be referred to as X-axis linear motor 72A and X-axis linear motor 70B as appropriate.

In the embodiment, Y-axis linear motors 68$a$ and 68$b$ and X-axis linear motor 72A structure a stage drive system that drives water stage WST1 two dimensionally in XY directions, whereas Y-axis linear motors 70$a$ and 70$b$ and X-axis linear motor 72B structure a stage drive system that drives wafer stage WST2 two dimensionally in XY directions.

In the embodiment, as it can be seen from the description above, a reaction force, which is generated in X-axis linear guides 72A and 72B when driving wafer stages WST1 and WST2 in the X-axis direction, travels to guide 76 and linear guides 66$a$ and 66$b$. Therefore, in order to reduce the influence of the reaction force as much as possible, a reaction canceling mechanism is preferably arranged in between guide 76 and sliders 74A and 74B utilizing electromagnets, and the reaction canceling mechanism is preferably controlled by the main controller (not shown)

depending on the movement state of the stages. Or, the main controller (not shown) may control an exhaust pressure of pressurized gas from pneumatic hydrostatic bearings provided in slider 74A and 74B, depending on the movement state of the stages.

On wafer stage WST1, wafer W1 is held by suction such as vacuum chucking (or electrostatic suction) via a wafer holder (not shown). Furthermore, on the upper surface of wafer stage WST1, a Y movable mirror 78Y, which has a reflection surface perpendicular to the Y-axis, is arranged extending in the X-axis direction on one end (the end on the –Y side) of the Y-axis direction, and an X movable mirror 78x, which has a reflection surface perpendicular to the X-axis, is arranged extending in the Y-axis direction on one end (the end on the –X side) of the X-axis direction. On each of the reflection surfaces of the movable mirrors 78Y and 78x, interferometer beams (length measurement beams) are projected, by each length measurement axis of interferometers (82 and 86) that structure an interferometer system (to be described later). And by photo-detecting the reflected beams, respectively, with each interferometer, misplacement of the reflection surface of each movable mirror from the reference position (normally, a fixed mirror is arranged on a side surface of the projection optical system or a side surface of an alignment system so as to set a reference position) is measured, thus, a two dimensional position of wafer stage WST1 is measured.

Similarly as above, on wafer stage WST2, wafer W2 is vacuum chucked via a wafer holder (not shown), and on the upper surface of wafer stage WST2, a Y movable mirror 80Y, which has a reflection surface perpendicular to the Y-axis, is arranged extending in the X-axis direction on one end (the end on the +Y side) of the Y-axis direction, and an X movable mirror Box, which has a reflection surface perpendicular to the X-axis, is arranged extending in the Y-axis direction on one end (the end on the –X side) of the X-axis direction. On each of the reflection surfaces of the movable mirrors BOY and BOX, interferometer beams are projected, by each length measurement axis of interferometers (84 and 86) that structure the interferometer system (to be described later), and a two dimensional position of wafer stage WST2 is measured likewise the wafer stage WST1 described above.

Next, the interferometer system for measuring the position of wafer stages WST1 and WST2 are described, mainly focusing on an arrangement of the length measurement axes or the like.

As is shown in FIG. 4, the interferometer system is configured including two Y-axis laser interferometers (hereinafter referred to as "Y-axis interferometer" or "interferometer") 82 and 84, and one X-axis laser interferometer (hereinafter referred to as "X-axis interferometer" or "interferometer") 86.

More particularly, Y-axis interferometer 82 has a length measurement axis BI1Y that passes through the optical axis of projection optical system PL and an optical axis of an alignment system ALG1 (coinciding with the center of detection) serving as a mark detection system, and is parallel to the Y-axis. Y-axis interferometer 82 irradiates an interferometer beam indicated as length measurement beam BI1Y almost perpendicularly on the reflection surface of Y movable mirror 78Y on wafer stage WST1. And, by receiving its reflected beams, Y-axis interferometer 82 measures the relative displacement of the reflection surface (or more precisely, the irradiation point of the interferometer beam in the reflection surface) from the reference position, and outputs the measurement values to the main controller (not shown). Y-axis interferometer 82 is a multiple-axis interferometer having a plurality of optical axes, and based on the output of Y-axis interferometer 82, the main controller measures not only the position of wafer stage WST1 in the Y-axis direction (Y position), but can also measure the rotational amount (the rotational amount around the X-axis (rolling) and the Z-axis (yawing)).

Similarly, Y-axis interferometer 84 has a length measurement axis BI2Y that passes through the optical axis of projection optical system PL and an optical axis of an alignment system ALG2 (coinciding with the center of detection), and is parallel to the Y-axis. Y-axis interferometer 84 irradiates an interferometer beam indicated as length measurement beam BI2Y almost perpendicularly on the reflection surface of Y movable mirror 80Y on wafer stage WST2. And, by receiving its reflected beams, Y-axis interferometer 84 measures the relative displacement of the reflection surface (or more precisely, the irradiation point of the interferometer beam in the reflection surface) from the reference position, and outputs the measurement values to the main controller (not shown) Y-axis interferometer 84 is a multiple-axis interferometer having a plurality of optical axes, and based on the output of Y-axis interferometer 84, the main controller measures not only the Y position of wafer stage WST2, but can also measure the rotational amount (rolling and yawing).

Incidentally, since each of the interferometer beams indicated as length measurement beams BI1Y and BI2Y irradiate Y movable mirror 78Y and 80Y at all times within the entire movement range of wafer stages WST1 and WST2, the position of wafer stages WST1 and WST2 in the Y-axis direction is controlled based on the measurement values of interferometers 82 and 84, even on times such as exposure using projection optical system PL and wafer alignment using alignment systems ALG1 and ALG2 and the like.

In addition, X-axis interferometer 86 has a length measurement axis BI2X which is the optical axis of projection optical system PL and is perpendicular to length measurement axes BI1Y and BI2Y, a length measurement axis BI1X which is the optical axis of alignment system ALG1 and is perpendicular to length measurement axis BI1Y, and a length measurement axis BI3X which is the optical axis of alignment system ALG2 (coinciding with the center of detection) and is perpendicular to length measurement axis BI2Y. X-axis interferometer 86 outputs the measurement values of these length measurement axes to the main controller (not shown).

In the embodiment, the main controller uses the measurement values of length measurement axis BI2X when measuring the position of wafer stage WST1 in the X-axis direction (X position) on exposure of wafer W1 using projection optical system PL and the X position of wafer stage WST2 on exposure of wafer W2 using projection optical system PL. In addition, the main controller uses the measurement values of length measurement axis BI1X when measuring the position of wafer stage WST1 in the X-axis direction when alignment system ALG1 is used, while using the measurement values of length measurement axis BI3X when measuring the position of wafer stage WST2 in the X-axis direction when alignment system ALG2 is used. Length measurement axes BI1X, BI2X, and BI3X each have a plurality of axes, and the main, controller can measure not only the Y position of wafer stages WST1 and WST2, but also the rotational amount (yawing and the rotational amount around the Y-axis (pitching)).

Although it is not shown, wafer stages WST1 and WST2 each have a linear encoder arranged.

That is, in the interferometer system above, a state occurs where interferometer beams in the X-axis direction do not irradiate the movable mirrors on wafer stages WST1 and WST2 and interferometers used for control need to be switched, such as when the stages move from the alignment position to the exposure position or from the exposure position to the wafer exchange position. During such movement, an accurate control on the position of wafer stages WST1 and WST2 becomes difficult, with only the interferometer system. The linear encoders are arranged for such cases, to monitor the X position of the wafer stages.

That is, on such movement, the main controller obtains the Y position, the X position, and the rotational amount of the two wafer stages WST1 and WST2 at a predetermined sampling interval based on information on Y position of wafer stages WST1 and WST2 measured by the interferometer system and on X position of wafer stages WST1 and WST2 measured by the linear encoders. Then, using the positional information obtained on the wafer stages, the main controller controls the movement of wafer stage WST1 by controlling the drive of Y-axis linear motors 68a and 68b, and X-axis linear motor 72A and the movement of wafer stage WST2 by controlling the drive of Y-axis linear motors 70a and 70b, and X-axis linear motor 72B.

As a matter of course, when interferometer beams from interferometer 86 irradiate the movable mirrors on wafer stages WST1 and WST2 again, the main controller (not shown) moves wafer stages WST1 and WST2 to a predetermined reference position using the measurement values of the Y-axis interferometer, the linear encoder, and the like, and then resets (or presets) the length measurement axes that were not used, and from then onward, controls the movement of wafer stages WST1 and WST2 based only on the measurement values of the interferometer system. In this manner, in the embodiment, the main controller (not shown) drives wafer stages WST1 and WST2 in the X-axis direction and Y-axis direction independently, without mechanically interfering each other.

Figure 5:
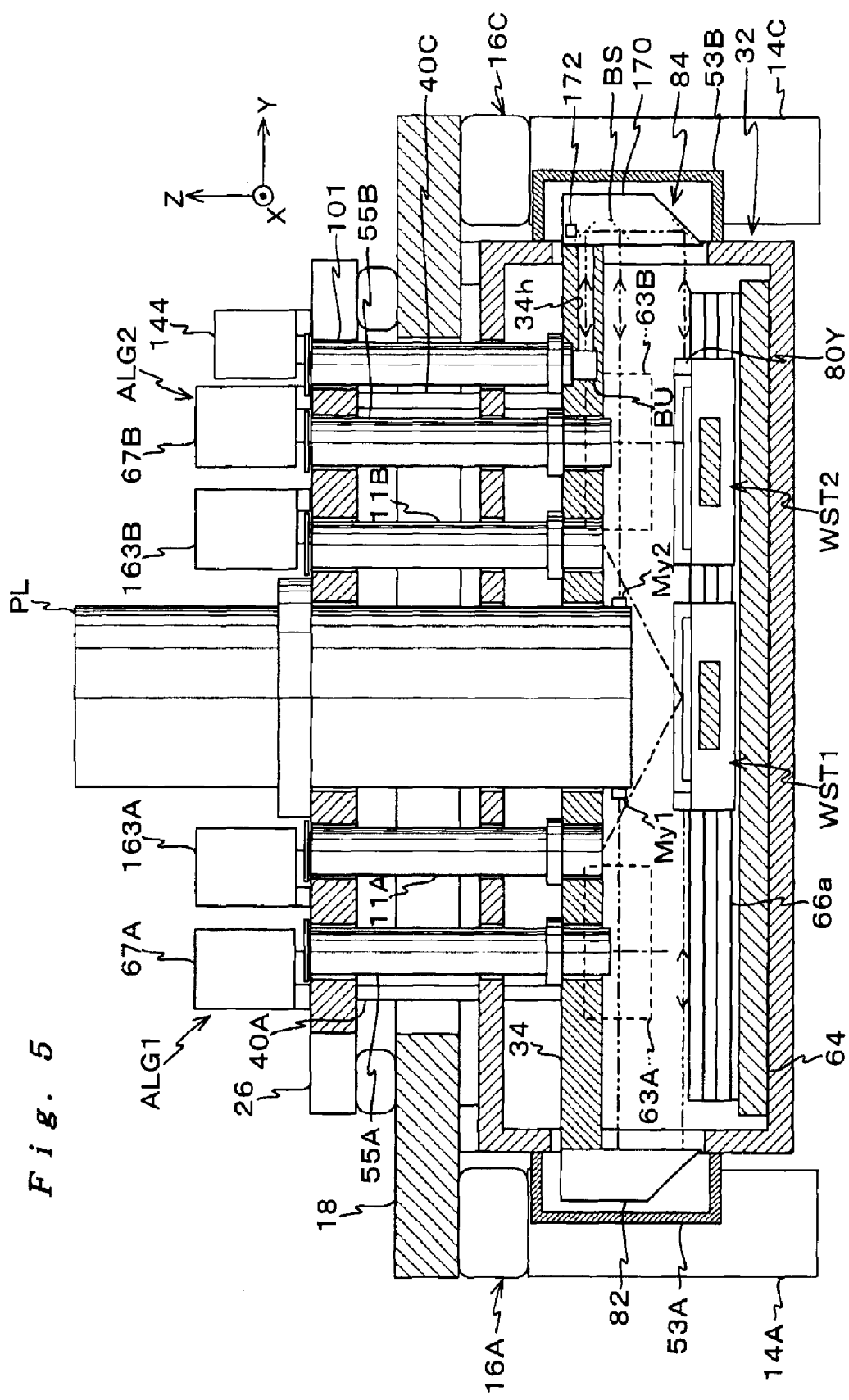
FIG. 5 is a sectional view of line F—F in FIG. 4.

In actual, as is shown in FIG. 5, which is a sectional view of line. F—F in FIG. 4, Y-axis interferometer 84 is made up of an interferometer main body unit 170, an interferometer beam relay portion 101, a laser head portion 144, a branch unit BU, and the like.

Laser head portion 144 has a laser light source emitting a laser beam inside, and is arranged on the upper surface of projection optical system support member 26.

Interferometer beam relay portion 101 has a barrel which upper end and lower end are held, respectively, by projection optical system support member 26 and a sensor column 34 (to be described later), and a relay optical system that is arranged inside the barrel.

Branch unit BU has a plurality of beam splitters, and is arranged inside sensor column 34 facing the lower end surface of interferometer beam relay portion 101.

Interferometer main body unit 170 has a mirror, a beam splitter BM, a detector 172, and the like, and is fixed to sensor column 34 (to be described later).

Following is a brief description of the operation of interferometer 84. The interferometer beam (laser beam) emitted from laser head portion 144 enters the branch unit BU via interferometer beam relay portion 101. This interferometer beam is split into 3 beams by the branch unit BU, and one of the beams (interferometer beam) passes through a laser path 34h formed in sensor column 34 and enters interferometer main body unit 170. The interferometer beam entering interferometer main body unit 170 is then divided into two beams, and one of the laser beams (the laser beam that has passed through beam splitter BS) is then incident on Y-axis movable mirror 80Y on wafer stage WST2 as the length measurement beam. In addition, the other laser beam (the laser beam that is reflected off the beam splitter BS) is incident on a fixed mirror My2 arranged on a lower end of the barrel of projection optical system PL as a reference beam. And, the length measurement beam and the reference beam reflected off the movable mirror 80Y and fixed mirror My2, respectively, are coaxially synthesized, and enters detector 172 as an interference light. Once the detector 172 receives the interference light, it outputs a signal corresponding to the number of interference fringes as an output signal. Incidentally, a polarization beam splitter is used as beam splitter BS, and a deflection element such as a quarter wave plate ($\lambda/4$ plate) is arranged at a predetermined position on the optical path, however, such details are omitted, so as to simplify the description.

The other interferometers 82 and 86 have a structure similar to interferometer 84 referred to above. In the embodiment, laser head portion 144, interferometer beam relay portion 101, and branch unit BU are common to the three interferometers 82, 84, and 86, and the interferometer beam split into three with the branch unit BU respectively becomes an interferometer beam for each interferometer.

The sensor column is arranged inside wafer stage chamber 32 for holding the interferometer main body units of interferometer 82, 84, and 86 and various sensors such as an automatic focus sensor (to be described later) and alignment systems AGL1 and AGL2. As is shown with the double dotted lines (imaginary lines) in FIG. 4, sensor column 34 comprises: a column main body portion having a rough octagonal shape in a planar view (when viewed from above); and a pair of extended portions that have a predetermined length (the tip edge surfaces are located within openings 32Wa and 32b) extending toward both −Y and +Y sides.

On the edge portion on the −X side of the column main body portion, the interferometer main body unit of X-axis interferometer 86, which measures the position of wafer stages WST1 and WST2 in the X-axis direction, is arranged. In addition, on the −Y side of the extended portion, on the edge portion opposite to the edge portion on the column main body portion side, the interferometer main body unit of Y-axis interferometer 82, which measures the position of wafer stage WST1 in the Y-axis direction, is arranged. Also, on the +Y side of the extended portion, on the edge portion opposite to the edge portion on the column main body portion side, the main body unit of Y-axis interferometer 84, which measures the position of wafer stage WST2 in the Y-axis direction, is arranged (refer to FIGS. 4 and 3).

An attachment structure and method of the sensor column assembly (that is, sensor column 34, and the interferometer main body units of the interferometers 82, 84, and 86 and the sensors fixed to sensor column 34) that has the structure above to main body BD is described next, focusing on the exploded perspective view shown in FIG. 3.

As is shown in FIG. 3, a total of nine circular openings are formed in the ceiling plate of upper chamber 32A. The largest opening formed in the center, circular opening 32Aa serving as a first opening, is an opening for inserting the barrel of projection optical system PL. Three circular openings 38a, 38b, and 38c, respectively formed at a position where the tips of a triangle formed on the outside of circular opening 32Aa are located, are openings for inserting three column support members 40A, 40B, and 40C that extend vertically downward from the lower surface of projection optical system support member 26, when attaching sensor column 34 to main body column BD. Of the five remaining circular openings 32A*b*, 32A*c*, 32A*d*, 32A*e*, and 32A*f* that serve as a second opening, a pair of circular openings 32A*d* and 32A*e*, closest to circular opening 32A*a*, are openings for inserting cylindrical portions 11A and 11B serving as light transmitting and light receiving barrel portions of the automatic-focus sensors. A pair of circular openings 32A*b* and 32A*c*, located on the outer side of openings 32A*d* and 32A*e*, are openings for inserting barrels 55A and 55B serving as barrel portions making up alignment systems ALG1 and ALG2. And, the remaining circular opening 32A*f* is an opening for inserting interferometer beam relay portion 101, which structures the interferometer system described earlier.

In sensor column 34, a circular opening 34*a* having the same diameter as circular opening 32A*a* is formed in the center portion, and in the longitudinal direction with respect to circular opening 34*a* five openings 34*b* to 34*g* are formed. The positional relationship between the five circular openings 34*b* to 34*f* and circular opening 34*a* is the same as the positional relationship between the above five openings 32A*b* to 32A*f* and circular opening 32A*a* provided in upper chamber 32A.

The attachment method for attaching the sensor column assembly or the like to main body column BD is described next.

Figure 6A:
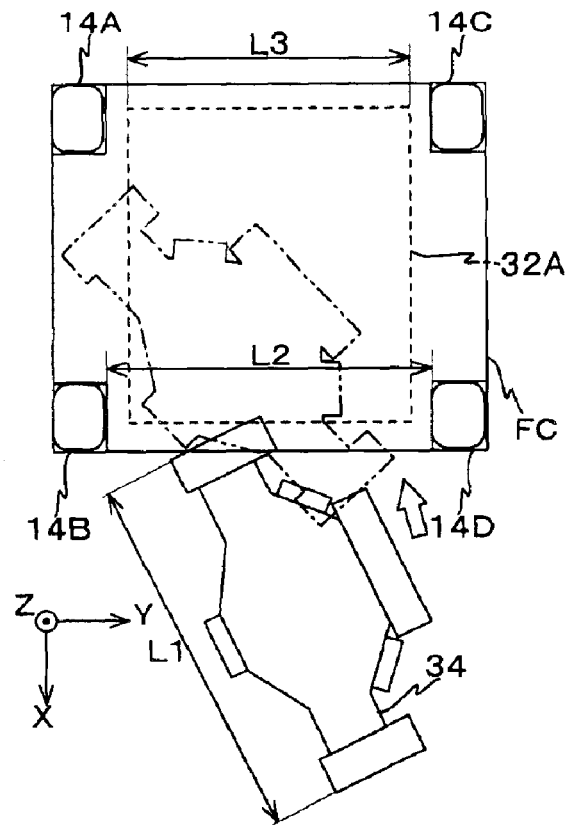
FIGS. 6A to 6D are views for describing an assembly method of a stage chamber.

Prior to the attachment, upper chamber 32A is fixed to the lower surface of base frame 18 by screws or the like. When attaching upper chamber 32A, column support members 40A, 40B, and 40C are respectively inserted in the three circular openings 38*a*, 38*b*, and 38*c*. In addition, the barrel of projection optical system PL is inserted into circular opening 26*a* formed in projection optical system support member 26 and circular opening 32A*a* formed in upper chamber 32A. FIG. 6A shows a planar view of upper chamber 32A after it is fixed in a suspended state to base frame 18. In this case, since the width of upper chamber 32A in the longitudinal direction. L3 is set smaller than the length between the first struts 14B and 14D L2. (L2>L3), the upper chamber 32A can be inserted linearly upward into the center portion of frame caster FC on assembly.

Next, sensor column 34 on which the interferometer main body units of interferometers 82, 84, and 86 are fixed (hereinafter referred to as "sensor column unit 34" as appropriate) is supported by suspension by projection optical system support member 26, specifically in the following manner.

Figure 6B:
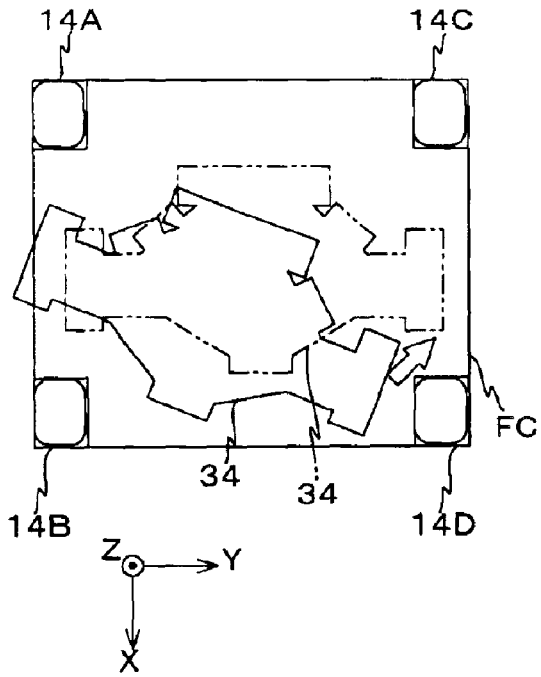

In this case, the width L1 of sensor column unit 34 in the longitudinal direction is wider than the width L3 of upper chamber 32A in the longitudinal direction, and is also wider than length L2 between adjacent two struts 14B and 14D of the first struts 14A to 14D. Therefore, first of all, as is shown in FIG. 6A, the sensor column unit 34 is inserted sideways from in between the two first struts 14B and 14D into the space between upper chamber 32A and frame caster FC. Then, as is shown in FIG. 6B, sensor column unit 34 is rotated with the area around the one end already inserted between upper chamber 32A and frame caster FC as the center, so as to also insert the other end between upper chamber 32A and frame caster FC.

After sensor column unit 34 is inserted into the space below upper chamber 32A in the manner above, as is shown in FIG. 3, cylindrical portions 11A and 11B of the automatic focus sensors, barrels 55A and 55B making up alignment systems ALG1 and ALG2, and interferometer beam relay portion 101 are inserted from above, respectively, into circular openings 34*b* to 34*f* of sensor column 34. Sensor column 34 then supports cylindrical portions 11A and 11B, barrels 55A and 55B, and interferometer beam relay portion 101 via their flange portions, completing the assembly of the sensor column portion. Next, the position of the sensor column assembly is adjusted to a predetermined position in the direction of six degrees of freedom below upper chamber 32A, and then sensor column unit 34 is drawn upward. During this process, the upper ends of cylindrical portions 11A and 11B, barrels 55A and 55B, and interferometer beam relay portion 101 are respectively inserted into circular openings 32A*b*, 32A*c*, 32A*d*, 32A*e*, and 32A*f* referred to earlier, formed in upper chamber 32A. In addition, at the same time, the barrel of projection optical system PL is inserted into circular opening 34*a* of sensor column 34 (refer to FIG. 5). Then, the sensor column assembly is moved upward by a predetermined amount, and sensor column 34 is joined to each of the lower end portion of column support members 40A, 40B, and 40C. In this manner, sensor column unit 34 is supported by suspension by projection optical system support member 26 via column support members 40A, 40B, and 40C (refer to FIG. 5).

Next, optical axis adjustment is performed by rotating two prisms (not shown) so that light emitted from laser head portion 144 which is arranged in advance on projection optical system support member 26 irradiates fixed mirrors Mx, My1, and My2 (however, fixed mirror Mx is not shown in FIG. 5, refer to FIG. 4) and then returns to the interferometer main body units of interferometers 82, 84, and 86, respectively, as is shown in FIG. 5. In addition, similar adjustment is performed on alignment systems ALG1 and ALG2, and automatic focus sensors via sensor head portions 67A, 67B, and 163A, or the like, respectively.

Figure 6C:
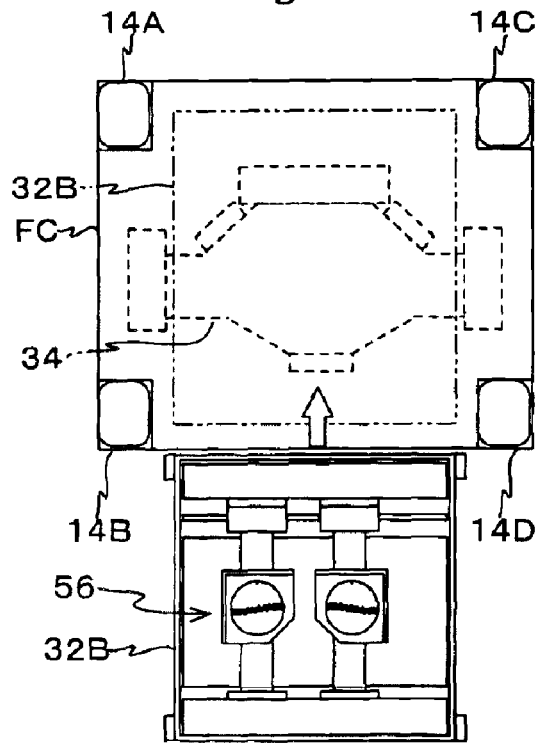
Figure 6D:
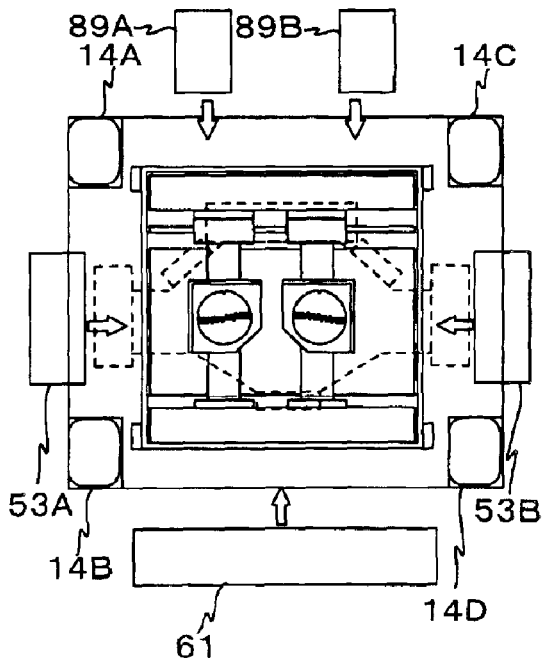

When the above operations are completed, lower chamber 32B is inserted linearly into the area enclosed with the four first struts 14A to 14D in a similar manner as when upper chamber 32 is inserted, and lower chamber 32B is then assembled with respect to base frame 18 and upper chamber 32A, as is shown in FIG. 6*c*.

Likewise, in this case, light is emitted from interferometer laser head 0.144, and optical adjustment is performed similarly as above by rotating two prisms (not shown) so that the lights irradiating each of the movable mirrors arranged on wafer stages WST1 and WST2 return to each of the interferometer.

Next, after the piping system and the wiring system are connected, wafer loader chamber 61 (to be referred to later), helium gas supply piping 89A and 89B, wiring/piping system covers 93A and 93B (refer to FIG. 4), covers 53A and 53B, and the like are attached to stage chamber 32.

Referring back to FIG. 4, reaction bars 88 and 90 are arranged at almost the same height from the floor surface on the side surfaces on the ±Y sides of lower chamber 32B. One end of reaction bars 88 and 90 are respectively fixed to reaction frames 94A and 94B fixed on floor surface F of the clean room, and reaction force generated in stage base 64 caused by wafer stages WST1 or WST2 within stage chamber 32 being driven in the X-axis direction is absorbed via lower chamber 32B by reaction bars 88 and 90 that have shock absorbers provided. In addition, the residual reaction force which could not be absorbed is released to the floor F via reaction frames 94A and 94B. Accordingly, vibration generated in stage chamber 32 due to the reaction-force of wafer stages WST1 or WST2 being driven in the X-axis direction is extremely small.

In addition, reaction bars 96 and 98 are arranged in the vicinity of the side wall on the +Y side of lower chamber 32B on both sides in the ±X direction. One end of reaction bars 96 and 98 are respectively connected to an edge portion on the +Y side of Y-axis linear guides 66*a* and 66*b*, via penetrating holes (not shown) formed in the side wall. The other end of the reaction bars 96 and 98 are respectively connected to reaction frame 94C fixed on the floor surface F of the clean room, as is with reaction bars 88 and 90 referred to earlier. Therefore, reaction force generated in Y-axis linear guides 66*a* and 66*b* caused by wafer stages WST1 or WST2 being driven in the Y-axis direction is absorbed by reaction bars 96 and 98 that have shock absorbers provided. In addition, the residual reaction force that could not be absorbed is released to the floor F via reaction frame 94C. Accordingly, vibration generated in stage chamber 32 due to the reaction force of wafer stages WST1 or WST2 being driven in the Y-axis direction is extremely small.

In addition, in the side wall on the −X side of lower chamber 32B, rectangular shaped openings 95A and 95B are formed. And, wiring/piping system covers 93A and 93B are attached corresponding to openings 95A and 95B, respectively, that house stage wiring/piping that does not fit in stage chamber 32. The wiring/piping or the like inside covers 93A and 93B are connected to each of the wafer stages, or their drive systems.

Figure 16:
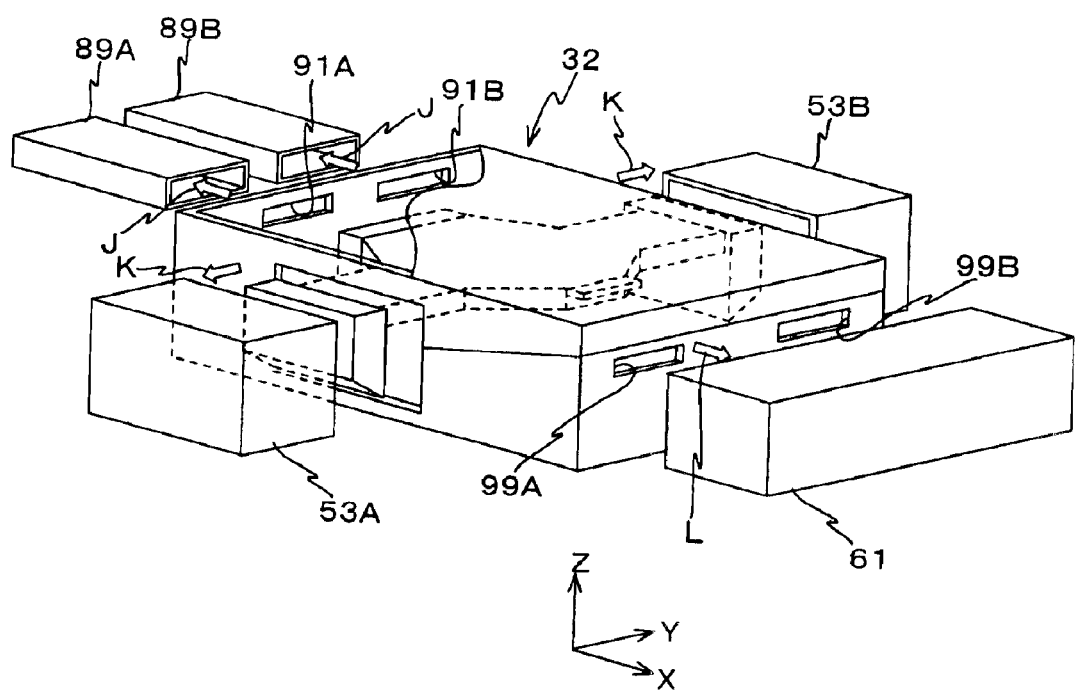
FIG. 16 is a view (part 2) for describing a maintenance method of an inside of a wafer stage chamber.

Although it is omitted in FIG. 4, in the side wall on the −X side of upper chamber 32A, openings 91A and 91B are formed (refer to FIG. 16). Helium gas supply piping 89A and 89B, which connect a space SS (refer to FIG. 2) serving as an air-tight sealed chamber (substrate chamber) formed within stage chamber 32 to helium gas supply devices 132A and 132B (refer to FIG. 1) via openings 91A and 91B, are attached to openings 91A and 91B. In the embodiment, helium gas supply devices 132A and 132B, and helium gas supply piping 89A and 89B structure a blowing portion.

Furthermore, as is shown in FIG. 4, rectangular shaped openings 99A and 99B are formed (refer to FIG. 3) in the side wall on the +X side of lower chamber 32B. And, in a state blocking openings 99A and 99B from the outside, wafer loader chamber 61 having a wafer loader chamber formed inside is arranged on the +X side of lower chamber 32B (the front surface side of the apparatus). Furthermore, interface section 31 is joined to the +X side of wafer loader 61 (refer to FIG. 1).

Figure 7:
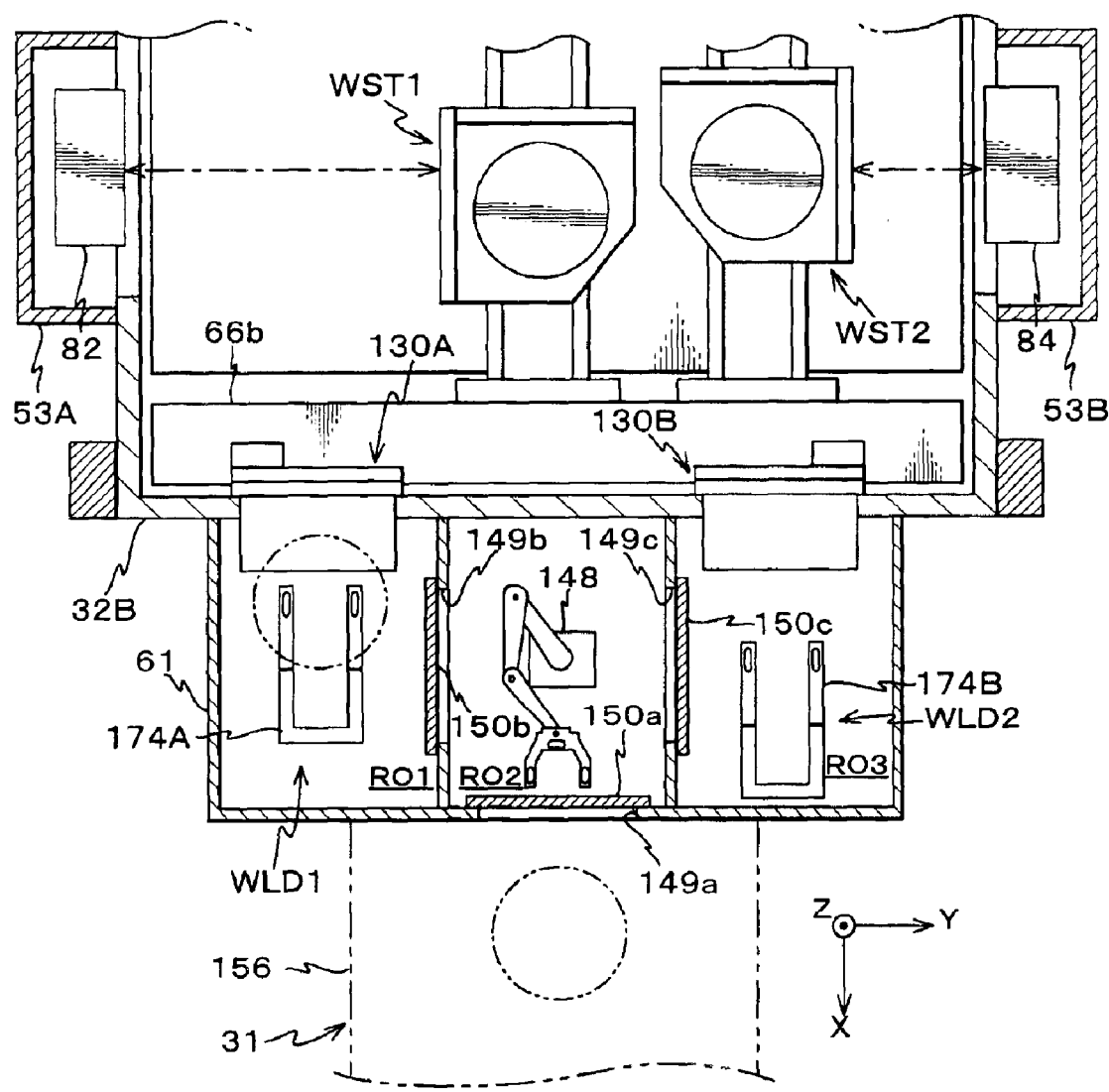
FIG. 7 is a planar view showing a wafer loader chamber in section.

Following is a more detailed description on wafer loader chamber 61, based on a sectional planar view in FIG. 7.

As is shown in FIG. 7, the inside of wafer loader chamber 61 is divided into three rooms adjacent in the Y-axis direction, that is, waiting rooms RO1 and RO3 on both sides, and a spare room RO2 in the middle. In the side wall on the +X side of spare room RO2, a load/unload opening 149*a* is formed for loading/unloading a wafer from interface section 31 connected outside the spare room RO2, and load/unload opening 149*a* is open/closed by an open/close door 150*a*. In addition, a carriage mechanism 148 made up of a horizontal jointed-arm robot (scalar robot) is arranged in the center of spare room RO2. Furthermore, on the side-walls of spare room RO2 on both sides in the Y-axis direction, opening portions 149*b* and 149*c* are arranged at a position of a predetermined height.

One of the opening portions 149*b* is opened/closed by a slide door 150*b* arranged in a vertical direction on the −Y side inside waiting room RO1. A wafer loader system WLD1 is arranged inside waiting room RO1. Wafer loader system WLD1 is structured including a first slide arm 174A that has a shape of a letter U in a planar view (from above) and a carrier or the like (not shown) that drives slide arm 174A along the X-axis direction and also finely drives slide arm 174A in the vertical direction (the Z-axis direction). In addition, a shutter mechanism 130A (to be referred to later) is arranged in a partition wall between waiting room RO1 and lower chamber 32B.

Similarly, the other opening portion 149*c* is opened/ closed by a slide door 150*c* arranged in a vertical direction on the +Y side inside waiting room RO3. A wafer loader system WLD2 is arranged inside waiting room RO3. Wafer loader system WLD2 is structured including a second slide arm 174B that has a shape of a letter U in a planar view (from above) and a carrier or the like (not shown) that drives slide arm 174B along the X-axis direction and also finely drives slide arm 174B in the vertical direction (the Z-axis direction). In addition, a shutter mechanism 130B (to be referred to later) is arranged in a partition wall between waiting room RO3 and lower chamber 32B.

In the embodiment, carriage mechanism 148 carries wafers between spare room RO2 and waiting room RO1, as well as between spare room RO2 and waiting room RO3. In addition, wafer loader system WLD1 carries wafers between waiting room RO1 and one of the wafer stages WST1. Likewise, wafer loader system WLD2 carries wafers between waiting room RO3 and the other wafer stage WST2. A wafer carrier for housing a plurality of wafers may be arranged at least inside either waiting rooms RO1 and RO3 or spare room RO2.

Figure 8:
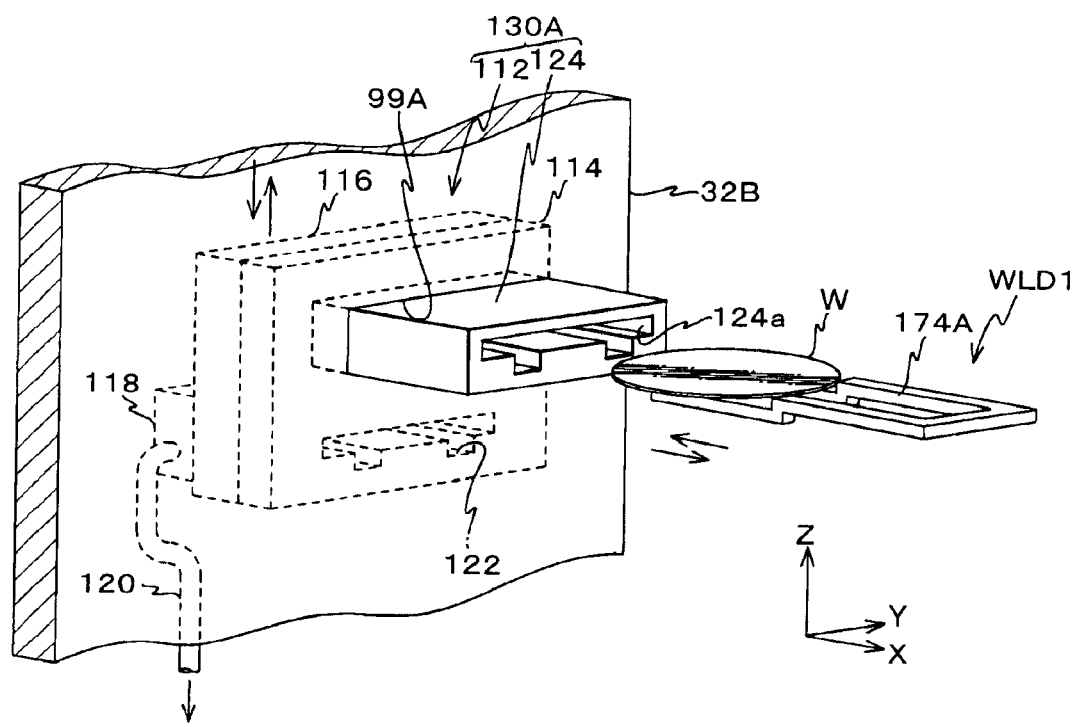
FIG. 8 is a perspective view showing a shutter mechanism.

Following are details on shutter mechanism 130A arranged on a boundary area of a wall of lower chamber 32B on the +X side and wafer loader chamber 61, based on a perspective view in FIG. 8.

As is shown in FIG. 8, shutter mechanism 130A comprises: a block-shaped passage forming member 124 inserted from the +X direction into opening 99A formed in the side wall of lower chamber 32B; and a passage open/ close device 112 which is arranged on the inner surface side (−X side) of the wall of lower chamber 32B on the +X side, facing a surface of passage forming member 124 on the −X side.

In passage forming member 124, a passage 124*a* which sectional shape is of a letter π (as in a geta (wooden clog)) is formed, extending in the X-axis direction. The set of depressed portions provided in the lower half of passage 124*a* is where the tip portions of slide arm 174A are inserted, and the slit shaped passage portion above the depressed portions is the area where the wafer and the base portion of slide arm 174A are inserted.

Passage open/close device 112 comprises: a first plate shaped member 114; a second plate shaped member 116 fixed to the first plate shaped member 114; a suction device 118 fixed to the second plate shaped member 116; and an exhaust piping 120 to which one end of suction device 118 is connected.

More specifically, a passage 122 that has the same shape as of passage 124*a* formed in passage forming member 124 is formed, penetrating the lower half portion of the first plate shaped member 114 and the second plate shaped member 116. In addition, although it is not shown, on the boundary area of the first plate shaped member 114 and the second plate shaped member 116 in passage 122, grooves are formed along the inner wall of passage 122, and a suction passage (not shown) is also formed so that the grooves are connected with suction device 118.

Suction device 118 is fixed to the surface on the −X side of the second plate shaped member 116, and is capable of exhausting gas inside passage 122 outside stage chamber 32 via the above grooves, suction passage, and exhaust piping 120 connected to suction device 118.

Following is a brief description on the operation of shutter mechanism 130A. In a state when wafers are not carried from wafer loader chamber 61 (or to be more specific, from waiting room RO1), passage 124a does not coincide with passage 122, as in the state shown in FIG. 8, whereas, for example, when a wafer is carried from waiting room RO1 into stage chamber 32, the main controller (not shown) senses that slide arm 174A of wafer loader system WLD1 has approached a predetermined position based on an output of a sensor (not shown) and slides passage open/close device 112 upward to a position where passage 1221n plate shaped members 114 and 116 coincides with passage 124a formed in passage forming member 124. And, with the movement of open/close device 112, at a point where a passage is formed connecting waiting room RO1 within wafer loader chamber 61 and space SS within stage chamber 32, a wafer controller (not shown) drives slide arm 174A holding wafer W in the −X direction via the carrier (not shown) so that the slide arm 174A enters wafer stage chamber 32 via the passage. Prior to the open/close device 112 moving upward to form the passage, the main controller starts to operate suction device 118.

With such operation, when loading wafers in the manner above, gas inside waiting room RO1 can be kept from mixing with low absorptive gas purged inside space SS of stage chamber 32 that has low absorptivity to exposure light (hereinafter also referred to as "purge gas") such as helium gas having a high purity which concentration of light absorbing material (impurities) such as oxygen, water vapor, hydrogen carbonate gas, or organic material is around or under 10 to 100 ppm, via passages 124a and 122. Accordingly, even if gas having a higher concentration of impurities than that of the purge gas in space SS is used as the purge gas of waiting room RO1, such as helium gas which concentration of impurities is around 100 to 1000 ppm, the purity level of helium gas within space SS hardly decreases.

The other shutter mechanism 130B has a structure similar to shutter mechanism 130A described above.

Alternately, an air curtain exhausting gas which is the same as the purge gas inside stage chamber 32 in a vertical downflow when the passages are in an open state can be used, instead of using suction device 118 employed in shutter mechanisms 130A and 130B in the embodiment.

Referring back to FIG. 2, reticle loader chamber 57 is arranged almost directly above wafer loader chamber 61. Inside reticle loader chamber 57, a reticle loader system (not shown) is arranged, and the reticle loader system performs reticle exchange between reticle loader chamber 57 and reticle stage RST in a reticle exchange portion 59.

On the ceiling surface of reticle loader chamber 57, a delivery port 143 shown in FIG. 1 is arranged. Delivery port 143 is a load/unload port for reticle containers that house reticles R. On the ceiling portion of the clean room located almost above delivery port 143, a second guide rail Hr serving as a track for OHV 135 which carries the reticle containers, is arranged extending in the Y-axis direction. As the reticle container, for example, a sealed type container such as a SMIF (Standard Mechanical Interface) Pod is used.

On the −X side of shutter mechanisms 130A and 130B inside stage chamber 32, pre-alignment mechanisms 63A (refer to FIG. 2) and 63B are arranged, as is shown in FIG. 5. These pre-alignment mechanisms are for detecting the position of the wafers (shift of center position and rotation) and for performing alignment.

FIG. 9 shows a schematic sectional view of space SS inside stage chamber 32 and its neighboring area. As is shown in FIG. 9, space SS is partitioned by stage chamber 32 and other members. In FIG. 9, a part of the members such as cylindrical portion 11A of the focus sensor is omitted for the sake of simplicity.

As is shown in FIG. 9, on the lower end portion of projection optical system PL, a seal mechanism 85 is provided for isolating the inside of projection optical system PL from the outside. Slightly above seal mechanism 85 on the barrel portion of projection optical system PL, a ring shaped protruded portion 71 is formed. And, on the upper surface of ring shaped protruded portion 71, a lower end of a cylindrical shaped flexible bellows 131 serving as a first connecting member is fixed by screw via a seal member such as an O-ring. In addition, an upper end of flexible bellows 131 is fixed to the periphery of circular opening 32A$a$ of upper chamber 32A by screw from below via a seal member such as an O-ring. With such an arrangement, the flow of gas from the space around projection optical system PL to space SS and from space SS to the space around the projection optical system PL is almost completely blocked.

Figure 10A:
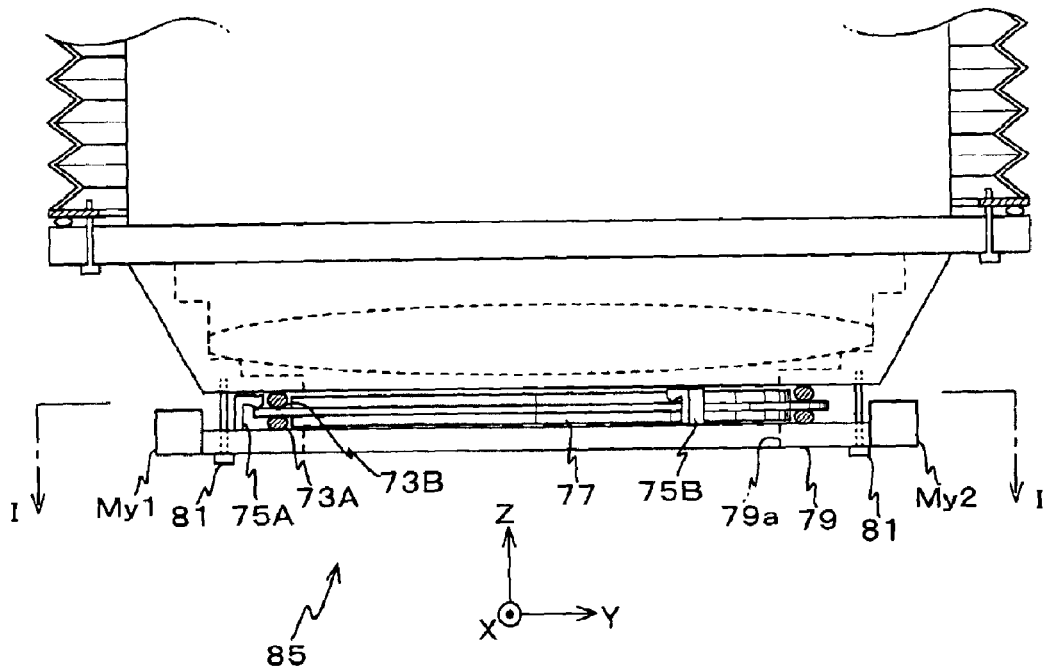
FIG. 10A is a view showing a sealed mechanism on an lower end of the projection optical system.

As is shown in FIG. 10A, seal mechanism 85 has a circular opening 79a in the center, and it comprises: a stop ring 79 made up of a ring shaped member that has a plurality of small circular holes formed at a predetermined interval on the entire circumference of its bottom surface; a first lens 77 (closest to the image plane) which is arranged above stop ring 79, has a rough disk shape, and is pushed upward by stop ring 79, and the like. In this case, stop ring 79 is fixed, screwed to the lower end portion of projection optical system PL by screws 81 that are inserted into each of the plurality of small circular holes.

More particularly, the first lens 77 is held to the upper surface of ring shaped member 79 via a seal member 73A such as an O-ring at three points by three holding members 75A, 75B, and 75C (refer to FIG. 10B), which are arranged almost at the tip positions of an equilateral triangle. Similarly, a seal member 73B such as an O-ring is also arranged in between the lower end surface of the barrel of projection optical system PL and the first lens 77.

Figure 11A:
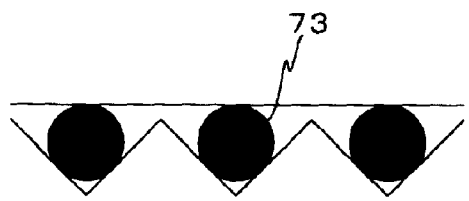
FIGS. 11A to 11D are views showing concrete examples of a seal member.
Figure 11B:
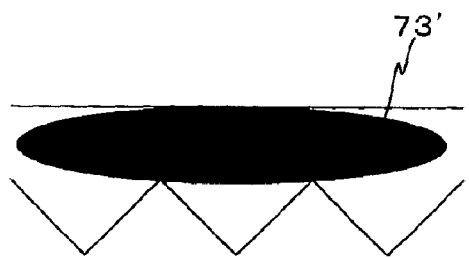
Figure 11C:

In the case of using O-rings for seal members 73A and 73B, the O-ring can-merely be clamped in between two surfaces. Or, for example, as is shown in FIG. 11A, on one of the surfaces an uneven portion which sectional shape is a wave shape can be formed, and O rings 73 that are normally used can be arranged in each of the base portion of the wave. In such a case, since a plurality of O-rings 73 are arranged in a concentric circle, the force acting on the O-rings can be dispersed compared with the case when only one O-ring is used, and the force on each of the O-rings is reduced. This can suppress deformation of the first lens 77, which makes it possible to suppress aberration or the like of projection optical system PL from being generated. In addition, sealing effect can be also sufficiently obtained. Or, as is shown in FIG. 11B, one of the surfaces may be uneven with a sectional shape of a wave shape, and a large type of O-ring 73', which is in line contact with the plurality of top portions of the wave, may be used as seal members 73A and 73B. In this case, as well, the sealing effect can be increased. Or, as is shown in FIG. 11C, an O-ring 73' larger than usual may be used as seal members 73A and 73B, and it can be merely be clamped in between two surfaces. In these cases, since local pressure on the first lens 77 can be reduced, it is possible to suppress deformation of the first lens 77. In addition, as the O-ring, an O-ring that has a hollow inside made from a relatively soft material may be used.

Figure 11D:

Incidentally, instead of the O-rings described above, a viscous member (such as fluorine grease) with a small outgas that can be used in a chemically clean state may be used as seal members 73A and 73B, as is shown in FIG. 11D.

In any case, the gas flow in between the inner space of projection optical system PL above the first lens 77 and space SS is almost completely cut off.

Figure 10B:
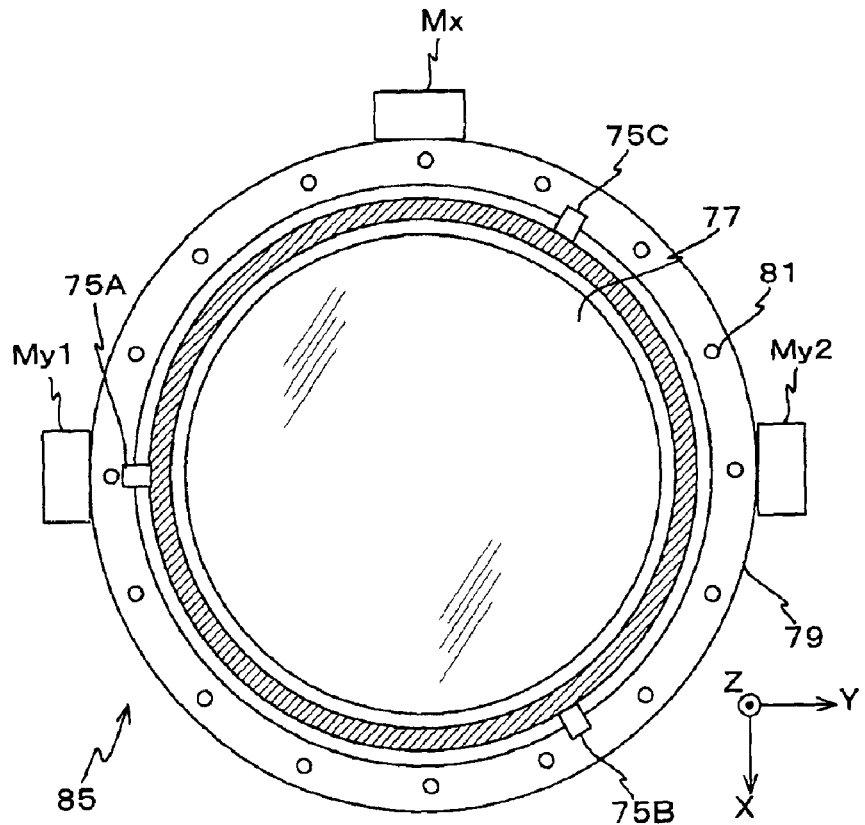
FIG. 10B is a sectional view of line I—I in FIG. 10A.

On the ±Y sides of stop ring 79, fixed mirrors My1 and My2 made up of corner cube mirrors are fixed. The fixed mirrors My1 and My2 are the reference when performing measurement with Y-axis interferometers 82 and 84. In addition, as is shown in FIG. 10B which is a sectional view of line I—I in FIG. 10A, on the edge portion in the −X direction of stop ring 79, a fixed mirror Mx made up of a corner cube mirror is fixed. The fixed mirror Mx is the reference when performing measurement with X-axis interferometer 86.

As is described earlier, sensor column 34 is supported by suspension from the lower surface of projection optical system support member 26 by column support members 40A to 40C (refer to FIG. 3), via openings 38a to 38c (refer to FIG. 3) formed on the upper surface of upper chamber 32A. In this case, as is representatively shown in column support member 40A in FIG. 9, a part of column support member 40A in between projection optical system support member 26 and upper chamber 32A is covered with a flexible bellows 87A. Flexible bellows 87A is screwed to projection optical system support member 26 and upper chamber 32A via seal members such as O-rings, and this prevents the flow of gas in between the inside and the outside of sealed space SS.

Further, column support member 40B is also covered with a bellows 87B as is shown in FIG. 2, and although it is not shown column support member 40C is covered likewise with a bellows.

Referring back to FIG. 9, barrel 55A, which structures alignment system ALG1, is supported by sensor column 34 via a flange FLGa provided lower than the center of barrel 55A, in a state where it is inserted into an opening 26b serving as a third opening, opening 32A*b*, and opening 34b formed in sensor column 34. In addition, as is shown in FIG. 9, the upper end surface of barrel 55A is set so that it almost coincides with the upper end surface of projection optical system support member 26. A three-point support and a kinematic structure can also be employed for flange FLGa, similar to flange FLG of projection optical system PL.

In addition, a part of barrel 55A in between projection optical system support member 26 and upper chamber 32A is covered with a flexible bellows 133A serving as a second connecting member. Similar to the flexible bellows that cover column support member 40A to 40C, flexible bellows 133A is screwed to projection optical system support member 26a and upper chamber-32A via O-rings or the like.

Furthermore, above the projection optical system support member 26 close to the upper surface of barrel 55A, an isolation mechanism 83 is arranged. Isolation mechanism 83 comprises a parallel plate glass 69 serving as a light transparent glass plate made of material such as glass. As is shown in FIG. 9, parallel plate glass 69 is screwed to the upper surface of projection optical system support member 26, via a seal member 190 such as an O-ring. Therefore, gas flowing to and from the upper side and the lower side of parallel plate glass 69 is stopped, almost without fail.

With alignment system ALG1, only barrel 55A that does not require adjustment is arranged within space SS, and sensor head portion 67A that has parts that require adjustment such as the light source is held on projection optical system support member 26 via a spacer member 65A, in a state with a predetermined space from parallel plate glass 69.

The other alignment system ALG2 (refer to FIG. 5) also has a structure similar to alignment system ALG1.

As is previously described, projection optical system support member 26 and sensor column 34 hold cylindrical portions 11A and 11B of the focus sensors shown in FIG. 5. Similar to alignment systems ALG1 and ALG2, with these focus sensors, only cylindrical portions 11A and 11B are arranged within space SS, and sensor heads 163A and 163B that require adjustment are arranged outside space SS. In addition, similar to barrel 55A of alignment system ALG1, cylindrical portions 11A and 11B of the focus sensors are also isolated from the outside by bellows, isolation mechanism, and seal members such an O-ring.

Furthermore, interferometer beam relay portion 101 held by projection optical system support member 26 and sensor column 34 also has a similar arrangement.

In the embodiment, as is obvious from FIGS. 4, 5, and 9 or the like, since a part of sensor column 34 and interferometer 82 (and interferometer 84) are arranged outside the stage chamber via window portion 32W*a* (and 32W*b*) of stage chamber 32, from the viewpoint of airtightness of space SS, covers 53A and 53B (refer to FIGS. 4 and 5 for cover 53B) are fixed to the stage chamber, screwed via gaskets (not shown) or the like from the outside of stage chamber 32.

As is obvious from the description so far, space SS (wafer chamber serving as a substrate chamber) is formed of stage chamber 32 (stage chamber main body 32', and covers 53A and 53B), seal mechanism 85 provided in projection optical system PL, isolation mechanism 83 arranged in each sensor, flexible bellows provided in various portions, O-rings serving as seal members, and the like.

Next, the active vibration isolation system that include the first vibration isolators and the second vibration isolators will be described, referring to FIGS. 12, 13A, 13B, and 14.

Figure 12:
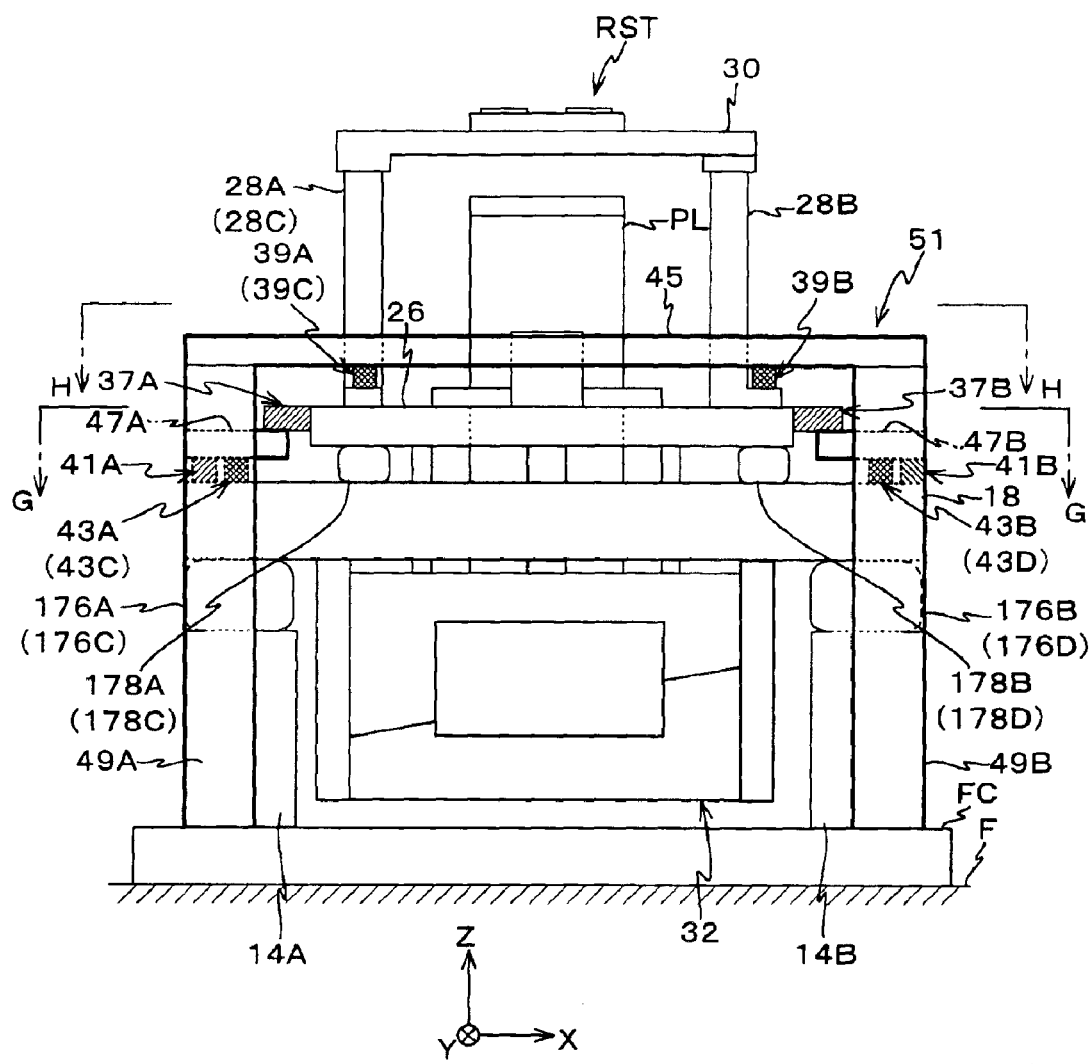
FIG. 12 is a view for describing a structure of an active vibration isolating system.

For example, such as in FIG. 2, although it is omitted to avoid complexities, in actual, on the frame caster FC further outside the main body column BD, a voice coil motor support frame 51 is arranged as is shown in FIG. 12.

Voice coil motor support frame 51 comprises: four fourth struts 49A, 49B, 49C, and 49D (fourth struts 49C and 49D arranged in the depth of FIG. 12 is not shown, refer to FIG. 13A); a pair of first bridging members 47A and 47B; a second bridging member 45, and the like.

Figure 13A:
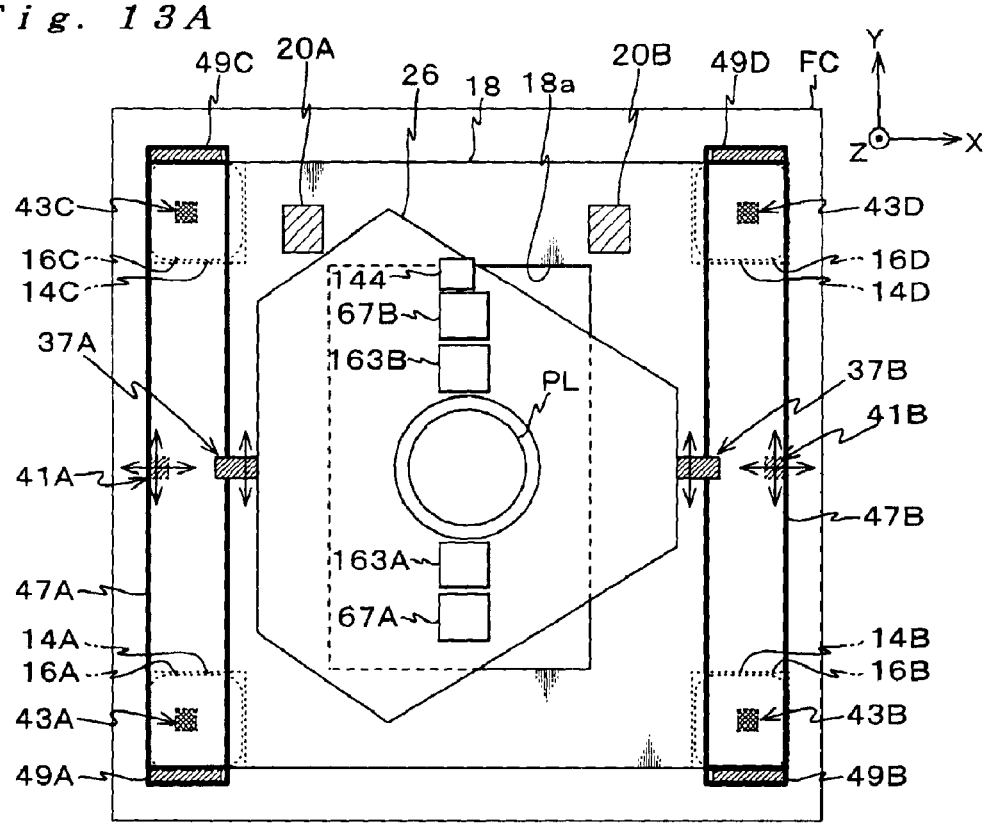
FIG. 13A is a sectional view of line G—G in FIG. 12.

More particularly, as is shown in FIG. 13A, which is a sectional view of line G—G in FIG. 12, fourth struts 49A, 49B, 49C, and 49D are arranged in the vicinity of the four corners on frame caster FC, further outside the first struts 14A to 14D. And, of the fourth struts, at the position slightly above the center in the height direction of the two struts 49A and 49C, the first bridging member 47A is arranged horizontally so as to bridge the fourth strut 49A and the fourth strut 49C. Also, at the position slightly above the center in the height direction of the remaining two struts 49B and 49D, the first bridging member 47B is arranged horizontally so as to bridge the fourth strut 49B and the fourth strut 49D.

As is shown in FIGS. 12 and 13A, the first bridging member 47A is made up of a plate shaped member which longitudinal direction is the Y-axis direction. To the lower surface of the first bridging member 47A in the vicinity of both ends in the Y-axis direction, a vibration control unit 43A which includes an acceleration sensor $43A_1$ (not shown in FIGS. 12, 13A, and 13B, refer to FIG. 14) serving as a vibration sensor for detecting vibrations of base frame 18 in the Z-axis direction and a Z-axis direction drive voice coil motor $43A_2$ (refer to FIG. 14) serving as an actuator, and a vibration control unit 43C which includes an acceleration sensor $43C_1$ (refer to FIG. 14) serving as a vibration sensor for detecting vibrations of base frame 18 in the Z-axis direction and a Z-axis direction drive voice coil motor $43C_2$ (refer to FIG. 14) serving as an actuator, are respectively fixed.

Voice coil mozors $43A_2$ and $43C_2$ that structure vibration control units 43A and 43C, respectively, are also the voice coil motors that structure the electromagnetic dampers of the first vibration isolators 16A and 16B previously described. That is, in the embodiment, an active vibration isolator (the first vibration isolator 16A in FIGS. 2 and 3) is structured including vibration control unit 43A and a mechanical damper made up of an air damper 176A (refer to FIG. 12). Similarly, an active vibration isolation unit (the first vibration isolator 16C in FIG. 3) is structured including vibration control unit 43C and a mechanical damper made up of an air damper 176C (refer to FIG. 12).

As is shown in FIGS. 12 and 13A, the other first bridging member 47B is made up of a plate shaped member which longitudinal direction is the Y-axis direction. To the lower surface of the first bridging member 47B in the vicinity of both ends in the Y-axis direction, a vibration control unit 43B which includes an acceleration sensor $43B_1$ (refer to FIG. 14) serving as a vibration sensor for detecting vibrations of base frame 18 in the Z-axis direction and a Z-axis direction drive voice coil motor $43B_2$ (refer to FIG. 14) serving as an actuator, and a vibration control unit 43D which includes an acceleration sensor 43D (refer to FIG. 14) serving as a vibration sensor for detecting vibrations of base frame 18 in the Z-axis direction and a Z-axis direction drive voice coil motor $43D_2$ (refer to FIG. 14) serving as an actuator, are respectively fixed.

Voice coil motors $43B_2$ and $43D_2$ that structure vibration control units 43B and 43D, respectively, are also the voice coil motors that structure the electromagnetic dampers of the first vibration isolators 16B and 16D previously described. That is, in the embodiment, an active vibration isolation unit (the first vibration isolator 16B in FIGS. 2 and 3) is structured including vibration control unit 43B and a mechanical damper made up of an air damper 176B (refer to FIG. 12). Similarly, an active vibration isolation unit (the first vibration isolator 16D in FIG. 3) is structured including vibration control unit 43D and a mechanical damper made up of an air damper 176D (refer to FIG. 12).

To the lower surface of the first bridging member 47A at the center area in the longitudinal direction, a vibration control unit 41A, which includes an acceleration sensor $41A_1$ (refer to FIG. 14) serving as a vibration sensor for detecting vibrations of base frame 18 in the X-axis direction and Y-axis direction and an X-axis/Y-axis direction drive voice coil motor $41A_2$ (refer to FIG. 14) serving as an actuator, is fixed. Similarly, to the lower surface of the first bridging member 47B at the center area in the longitudinal direction, a vibration control unit 41B, which includes an acceleration sensor $41B_1$ (refer to FIG. 14) serving as a vibration sensor for detecting vibrations of base frame 18 in the X-axis direction and Y-axis direction and an X-axis/Y-axis direction drive voice coil motor $41B_2$ (refer to FIG. 14) serving as an actuator, is fixed.

Furthermore, to the upper surface of the first bridging member 47A at the center area in the longitudinal direction, a vibration control unit 37A, which includes an acceleration sensor $37A_1$ (refer to FIG. 14) serving as a vibration sensor for detecting vibrations of projection optical system support member 26 in the Y-axis direction and a Y-axis direction drive voice coil motor $37A_2$-(refer to FIG. 14) serving as an actuator, is fixed. Similarly, to the upper surface of the first bridging member 47B at the center area in the longitudinal direction, a vibration control unit 37B, which includes an acceleration sensor $37B_1$ (refer to FIG. 14) serving as a vibration sensor for detecting vibrations of projection optical system support member 26 in the Y-axis direction and a Y-axis direction drive voice coil motor $37B_2$ (refer to FIG. 14) serving as an actuator, is fixed.

Figure 13B:
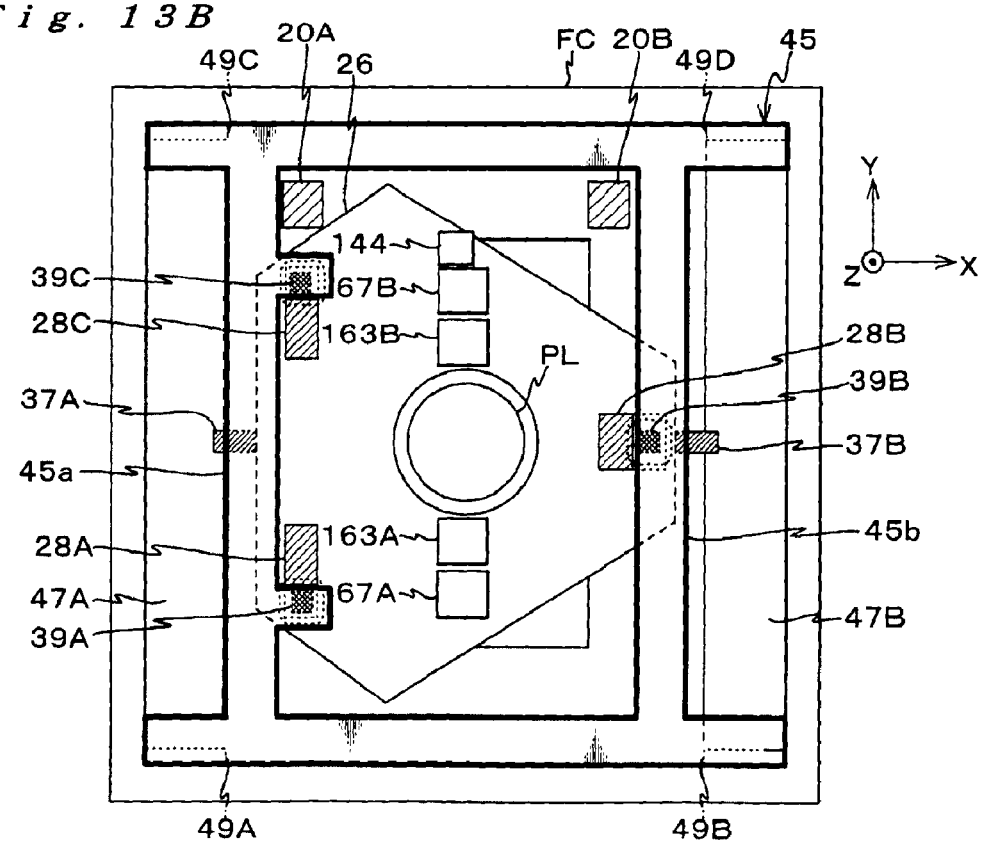
FIG. 13B is a sectional view of line H—H in FIG. 12.

As is shown in FIGS. 12 and 13B, which is a sectional view of the line H—H in FIG. 12, the second bridging member 45 is made up of a frame member that has a rough square shape when viewed from above, and is arranged horizontally in a state connecting the upper end portions of the four fourth struts 49A to 49D to one another. At three predetermined places on the lower surface of the second bridging member 45, vibration control units 39A, 39B, and 39C that include acceleration sensors ($39A_1$, $39B_1$, and $39C_1$, (refer to FIG. 14)) serving as vibration sensors for detecting vibrations of the third struts 28A, 28B, and 28C in the Z-axis direction, respectively, and Z-axis direction drive voice coil motors ($39A_2$, $39B_2$, and $39C_2$ (refer to FIG. 14)) serving as actuators, are respectively fixed. As is obvious from FIGS. 12 and 13B, these vibration control units 39A, 39B, and 39C are joined to projection optical system support member 26 via projected portions at the lower end of each of the third struts 28A, 28B, and 28C, and not only can vibration of projection optical system support member 26 be controlled but also vibration control of reticle fine movement stage base 30 in the Z-axis direction is possible.

Voice coil motors $39A_2$, $39B_2$, and $39C_2$ that structure vibration control units 39A, 39B, and 39C, respectively, are also the voice coil motors that structure the electromagnetic dampers of the second vibration isolators 24A, 24B, and 24C previously described. That is, in the embodiment, an active vibration isolation unit (the second vibration isolator 24A in FIG. 2) is structured including vibration control unit 39A and a mechanical damper made up of an air damper 178A (refer to FIG. 12). Similarly, an active vibration isolation unit (the second vibration isolator 24B in FIG. 2) is structured including vibration control unit 39B and a mechanical damper made up of an air damper 178B (refer to FIG. 12). Likewise, an active vibration isolation unit (the second vibration isolator 24C in FIG. 3) is structured including vibration control unit 39C and a mechanical damper made up of an air damper 178C (refer to FIG. 12).

Figure 14:
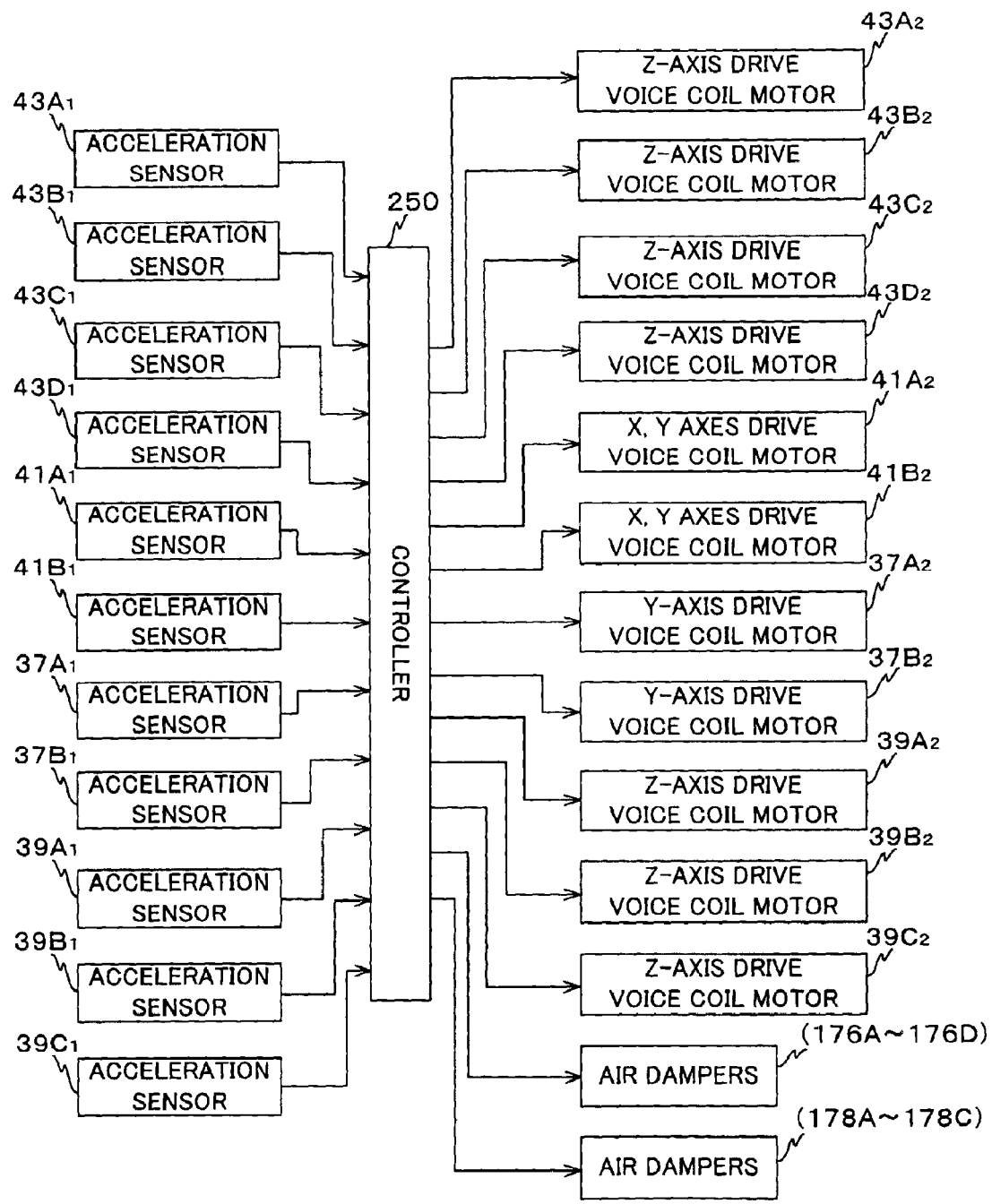
FIG. 14 is a view showing a control system of an active vibration isolator.

In the embodiment, a controller 250 shown in FIG. 14 calculates the vibration of base frame 18 (the first frame ST1) in directions of six degrees of freedom, based on the output of acceleration sensors $43A_1$ to $43D_1$, $41A_1$, and $41B_1$ that structure vibration control units 43A to 43D, 41A, and 41B, respectively. And, by controlling voice coil motors $43A_2$ to $43D_2$, $41A_2$, and $41B_2$ that structure vibration control units 43A to 43D, 41A, and 41B, respectively, and air dampers 176A to 176D, controller 250 controls the vibration of base frame 18 (the first frame ST1) in directions of six degrees of freedom with voice coil motor support frame 51 as a datum. In addition, controller 250 calculates the vibration of projection optical system support member 26 (the second frame-ST2) in directions of six degrees of freedom, based on the output of acceleration sensors $39A_1$ to $39C_1$, $37A_1$, and $37B_1$ that structure vibration control units 39A to 39C, 37A, and 37B, respectively. And, by controlling voice coil motors $39A_2$ to $39C_2$, $37A_2$, and $37B_2$ that structure vibration control units 39A to 39C, 37A, and 37B, respectively, and air dampers 178A to 178C, controller 250 controls the vibration of projection optical system support member 26 (the second frame ST2) in directions of six degrees of freedom with voice coil motor support frame 51 as a datum.

In order to simplify the description, the effect of vibration control due to the active vibration isolation system in the embodiment will be examined next, focusing on one axis, such as an axis in the Z-axis direction.

In this case, the primary delay control response transfer function G(S) due to the voice coil motor (VCM) can be determined as in equation (1) below:

$$G(S)=2\pi v/(2\pi v+2\pi Fj), \quad (1)$$

where F is the number of vibration and v is the response frequency.

In addition, when the air damper is assumed to be a spring, the transfer function Q(S) can be expressed as in equation (2) below:

$$Q(S)=1/\{-(2\pi F)^2/(2\pi v)^2+\zeta\times(2\pi F)j+1\}, \quad (2)$$

where $\zeta$ is the damping ratio.

Therefore, when the logarithmic decrement is $\delta$, the damping ratio $\zeta$ can be expressed as in equation (3) below:

$$\zeta=\delta/\sqrt{\{\delta^2+(2\pi)^2\}}. \quad (3)$$

The logarithmic decrement $\delta$ can be expressed as in equation (4) below:

$$\delta=LN(1/X), \quad (4)$$

where X is the damping factor per vibration.

When the air damper is arranged in parallel with the voice coil motor (VCM), and the VCM is to be controlled according to the detection results of the acceleration sensor above the air damper, the following points (a. to e.) can be considered. In actual, DC component is controlled based on detection values of a displacement sensor (position sensor), however, in this case, it is supposed that all the components are controlled based on the detection values of the acceleration sensor.

a. Floor vibration does not affect the acceleration sensor above the air damper; therefore, vibration values determined by the air damper characteristics are detected.

b. The air damper is a type of spring; therefore, it has a resonance point. The resonance increases when the damping ratio $\zeta$ decreases.

c. The damping ratio $\zeta$ is a function of the damping factor (logarithmic decrement $\delta$); therefore, the resonance can be suppressed by increasing the damping factor X per vibration by VCM control.

d. The damping ratio $\zeta$ is to be recalculated with damping factor (logarithmic decrement $\delta$) by control determined by control response transfer function, and control error is to be calculated with a premise of performing control by primary delay control response.

e. Then, the effect related to floor vibration error when vibration control is performed with only one platform of air damper (vibration isolator) and when vibration control is performed comprising two platforms of air dampers (vibration isolators) in series as in this embodiment is compared by this method. In this case, although resonance due to coupled vibration occurs, since the effect of the air dampers for removing high frequency vibration is enhanced, a high effect of suppressing background vibration from the floor can be obtained. The effect is especially large at places where the floor rigidity is low.

Accordingly, when a reaction frame is employed for releasing the reaction force to the floor when wafer stages are driven and floor rigidity has a large influence as in this embodiment, the arrangement of having two platforms of air dampers (vibration isolators) in series-has a great advantage.

Figure 15A:
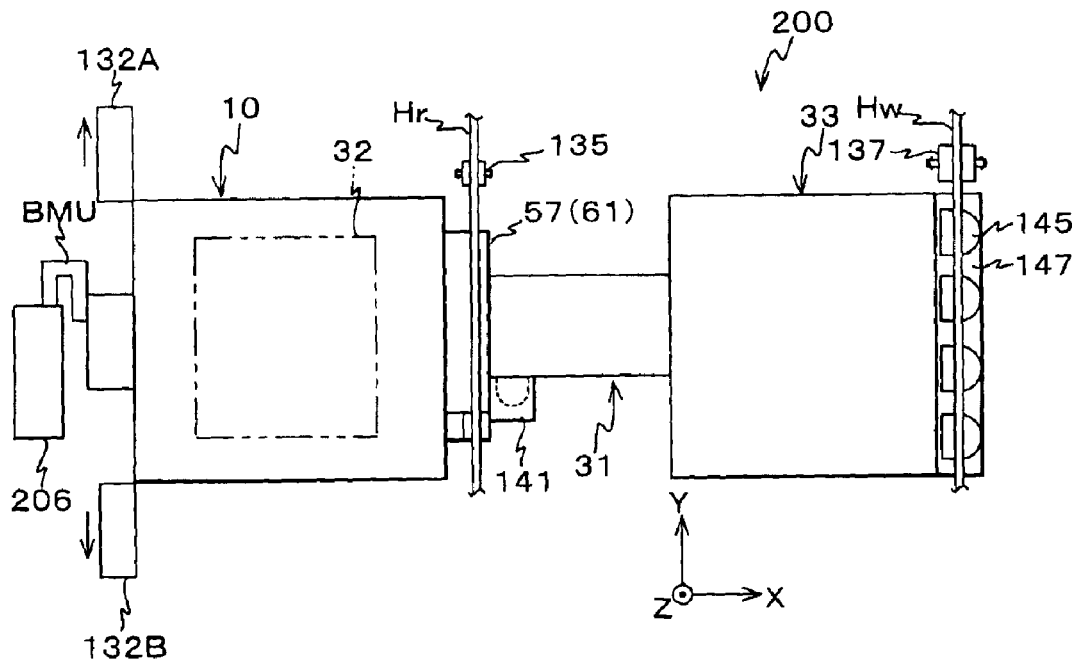
FIGS. 15A and 15B are views (part 1) for describing a maintenance method of an inside of a wafer stage chamber.
Figure 15B:
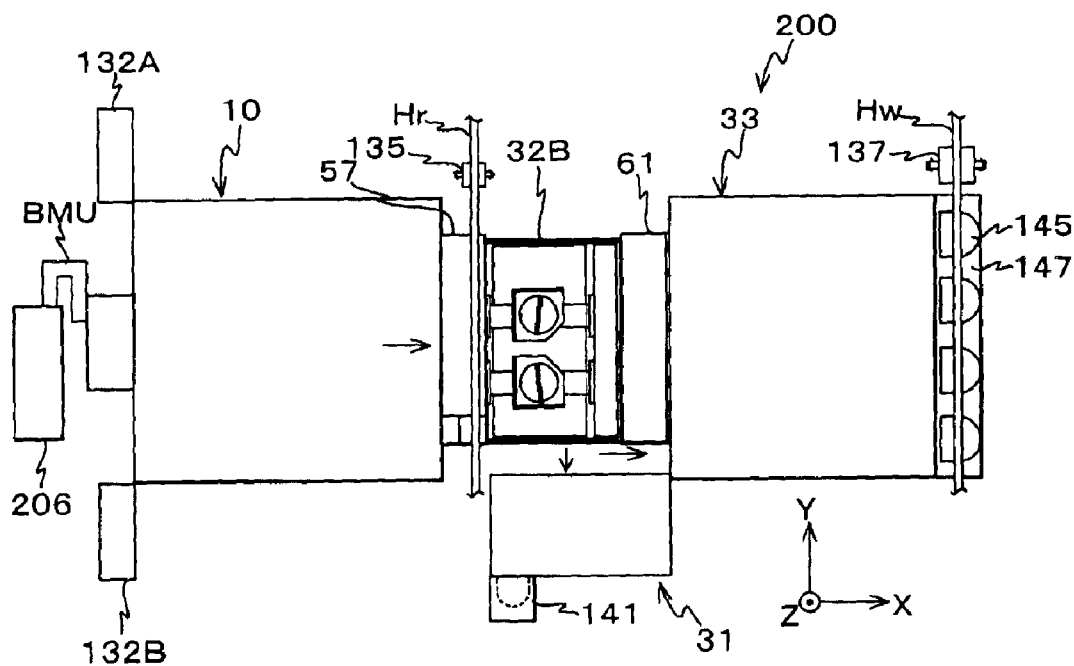

Next, a method of maintaining the inside of wafer stage chamber 32, which is built into the main body column BD in the manner above, is briefly described referring to FIGS. 15A, 15B, and 16.

For example, in the case of performing simple maintenance such as cleaning the wafer holder or taking out the wafers, the service engineer or the operator (hereinafter generally referred to as the "operator") first of all, moves helium gas supply devices 132A and 132B in a sideways direction of the devices, that is, in the +Y direction and −Y direction, respectively, as is shown in FIG. 15A. Next, the operator detaches helium gas supply piping 89A and 89B from the back of exposure apparatus 10 as is shown by arrow J in FIG. 16, and then performs maintenance operations inside the stage chamber 32 such as cleaning the wafer holder, while visually checking the steps.

In addition, for example, when maintenance is to be performed on wafer stage device 56 where it cannot be reached from the side of openings 91A and 91B (the rear side of the apparatus), such as when adjusting the optical axes of wafer interferometers, covers 53A and 53B are detached as is shown by arrow K in FIG. 13. And then, the operator performs optical axes adjustment on the wafer interferometers.

Furthermore, when a more significant maintenance is to be performed such as exchanging a linear motor or detaching the pre-alignment mechanism that cannot be handled in the manner above, the operator, first of all, moves interface section 31 and FOUP additional housing 141 in the −Y direction, as is shown in FIG. 15B. Next, the operator detaches wafer loader chamber 61 and moves it to the +X side (the front of the apparatus). Then, the operator detaches reaction bars 88, 90, 96, and 98 (refer to FIG. 4) used for releasing reaction force from stage chamber 32. In the embodiment, from the viewpoint of a compact design for the entire apparatus, the reaction bars are connected to the linear motors for driving the wafer stages from outside the stage chamber 32 (and the stage chamber also shielded) after the stage chamber 32 is built into main body column BD, and the reaction frames receiving the reaction force of the reaction bars the reaction bars are arranged outside the apparatus. Accordingly, when maintenance is performed on the stage supporting beds or the like in stage chamber 32, the reaction frames are also detached so as to secure the space for moving lower chamber 32B.

The operator then detaches lower chamber 32B from the front side of the apparatus (the +X side), and performs the significant maintenance such as exchanging the linear motors and detaching the pre-alignment mechanism.

As is described, in the embodiment, maintenance operations on the exposure apparatus can be performed without having to stop the operations of the substrate processing system arranged adjacent to the exposure apparatus.

The reason that the maintenance can be performed in the manner described above is because exposure apparatus 10 employs a structure where base frame 18 is supported with four struts 14A to 14D as the structure for the first frame ST1, which holds the stage chamber 32. That is, normally, a three-point supporting structure for supporting the base frame with three struts is employed from the viewpoint that it practically prevents distortion from occurring in the base frame. When the three-point supporting structure is employed, however, a strut is located at the rear end (back) of the apparatus. Therefore, maintenance from the rear end becomes difficult, and the directions from which maintenance operations can be performed are restricted. On the other hand, in the embodiment, the four struts support base frame 18, which makes it possible to perform a linear operation with respect to stage chamber 32. That is, as is described earlier, maintenance operations on wafer stage device 56 can be performed easily, by simply detaching helium gas supply devices 132A and 132B from the rear side of the apparatus.

In addition, by employing the above four-point supporting structure, stage chamber 32 which has a large cuboid shape and houses wafer stages WST1 and WST2 inside can be held in a stable manner with high rigidity. In this case, by controlling pressure of air dampers arranged at four places, distortion may occur in base frame 18, which is larger than the distortion occurring when the three-point supporting structure is employed. In the embodiment, however, the sensors that require accuracy (such as alignment system ALG1 and ALG2) are all attached to projection optical system support member 26 which has a three-point supporting structure and to sensor column 34 which is supported by suspension at three points from projection optical system support member 26. Therefore, exposure accuracy does not deteriorate due to distortion, unless a distortion large enough so that the gap between wafer stage base 64 structuring wafer stage 56 and wafer stages WST1 and WST2 exceeds a permissible value is generated in base frame 18.

As is obvious from the description so far, in the embodiment, projection optical system support member 26, sensor column 34, and column support members 40A to 40C structure a second main body. In addition, base frame 18, the first vibration isolators 16A to 16D, and the first struts 14A to 14D structure a support unit.

As is described in detail so far, with exposure apparatus 10 related to the embodiment, the first frame ST1 which supports reticle stage RST and wafer stages WST is supported at four points by the first vibration isolators 16A to 16D, and projection optical system support member 26 which holds projection optical system PL is supported on base frame 18 at three points that are not colinear by three second vibration isolators 24A to 24C. Therefore, subtle vibration traveling from floor surface F to the first frame ST1 is suppressed by the first vibration isolators 16A to 16C, while vibration which occurs due to the movement of stages held by the first frame ST1 is suppressed or prevented from traveling to projection optical system support member 26 by the second vibration isolators 24A to 24C. Accordingly, vibration occurring in projection optical system PL supported by projection optical system support member 26 can be effectively suppressed. In addition, since projection optical system support member 26 is supported on the first frame ST1 at three points by the three second vibration isolators, this structure is not likely to cause deformation in projection optical system support member 26 which is supported. Accordingly, vibration and tilt or the like in projection optical system PL hardly occurs, therefore, deterioration in projection images due to these factors can be avoided, almost without fail. As a consequence, exposure with high precision becomes possible, which in turn improves the yield of devices serving as end products.

In addition, since the first frame ST1 is supported at four points by the first vibration isolators 16A to 16D, the first frame ST1 and the stages supported by the first frame ST1 can be supported in a stable manner with high rigidity. In addition, for example, the four first vibration isolators 16A to 16D can be arranged on the four corners of a square, which increases at least one direction from which maintenance operations can be performed on members arranged in the space below the first frame ST1, compared with when the first frame ST1 is supported at three points. Accordingly, the degree of freedom during maintenance increases, which improves the workability, which in turn makes it possible to reduce the time required for maintenance and improves the operation rate of the apparatus. As a result, it becomes possible to increase the productivity of devices serving as end products.

In addition, in the embodiment, since interferometers, cylindrical portions of the automatic focus sensors, and sensor column 34 that holds the cylindrical portions of the alignment systems are supported by suspension from projection optical system support member 26 which vibration is suppressed, the influence of vibration on wafer position detection accuracy, mark detection accuracy, and exposure accuracy can be suppressed to the maximum.

In addition, in upper chamber 32A structuring stage chamber 32 in which space SS that houses wafer stage WST1 is formed, circular opening 32Aa is formed where members of projection optical system PL held by the second frame ST2 on the image plane side can be inserted. Also, flexible bellows 131 connects the peripheral portion of circular opening 32Aa in upper chamber 32A and the circumferential portion of projection optical system PL, as well as isolate the inside of space SS in an air-tight state from the outside air. Accordingly, projection optical system PL and stage chamber 32 can be connected in a simple manner, while the inside of both the projection optical system and the wafer chamber (space SS) can be made into a state sealed from the outside. This prevents outer air and dust or the like from mixing into the optical path of illumination light IL, from projection optical system PL to the wafer, and allows the degree of cleanliness (in some cases including the degree of chemical cleanliness) to be maintained within space SS. Accordingly, decrease in transmittance due to absorption of illumination light IL by impurities can be suppressed, and exposure with high accuracy is possible for a long period of time. In addition, vibration of stage chamber 32 generated by the movement of wafer stage WST is almost all absorbed by the expansion/contraction, and deformation of flexible bellows 131, therefore the vibration hardly affects projection optical system PL held by the second frame ST2. Accordingly, exposure with high accuracy (the transfer of a reticle pattern onto a wafer) is possible for a long period of time, which improves the yield of devices serving as an end product.

In addition, in the embodiment, the barrel portions structuring the various types of detection systems are arranged within space SS, which is formed by members such as stage chamber 32, whereas the sensor head portions are arranged outside space SS, on the other side of the glass plate isolating the inside of space SS from the outside. Therefore, since only the sensor head portions that require adjustment is arranged outside the space, adjustment on the various types of detection systems can be performed easily.

In addition, the first frame ST1 supports stage chamber 32, where members of projection optical system PL on the image plane side is inserted and in which space SS that houses wafer stage WST is formed, by suspension. Reaction bars 88, 90, 96, and 98 that transfer the reaction force due to the drive of wafer stage WST1 to the floor are also joined to stage chamber 32. That is, stage chamber 32 is supported by suspension by the first frame ST1, and furthermore, the reaction force due to the drive of wafer stages WST1 and WST2 within stage chamber 32 is transferred to the floor surface via the reaction bars. Accordingly, vibration or the like hardly travels at all in stage chamber 32, therefore, vibration traveling to projection optical system PL via stage chamber 32 is suppressed. That is, even if a part of projection optical system PL is inside a sealed chamber, adverse effect on exposure accuracy due to vibration can be reduced. As a consequence, exposure accuracy can be improved, which makes it possible improve the yield of devices serving as an end product, and its productivity can be improved.

In addition, in the embodiment, since at least a part of interferometers 82 and 84 used for measuring the positions of wafer stages WST1 and WST2 are arranged in a state projecting outside stage chamber 32, and the periphery is covered with covers 53A and 53B, the size of stage chamber main body 32' can be reduced to the extreme while maintaining the air-tightness within stage chamber 32. Accordingly, the footprint of the entire exposure apparatus can be reduced.

Furthermore, with substrate processing system 200 in the embodiment, interface section 31 located in between exposure apparatus 10 and substrate processor 33 can be moved, as well as stage chamber 32 drawn out into the space between exposure apparatus 10 and substrate processor 33 from the first frame ST1 structuring the exposure apparatus main body 10A within main body chamber 152, during maintenance operations. Accordingly, the space between exposure apparatus 10 and substrate processor 33 can be utilized when performing maintenance operations within stage chamber 32. That is, since maintenance operations on a single substrate processing system can be performed without having to stop the operation of neighboring substrate processors in a factory where a plurality of substrate processing systems are arranged, the productivity of devices serving as an end product can be improved.

In the embodiment above, stage chamber 32 in which wafer stage devices are arranged is supported by suspension from base frame 18, however, the present invention is not limited to this, and for example, the stage chamber may be mounted on the floor surface F via vibration isolators, instead of being supported by suspension.

In the embodiment above, since the arrangement is employed where the inside of projection optical system PL is completely isolated from the inside of stage chamber 32, the inside of projection optical system PL and the inside of stage chamber 32 can be purged (in other words, the inside gas is replaced with purge gas) with different gases, however, as a matter of course, the inside can each be purged with the same gas.

<<Second Embodiment>>

Figure 17A:
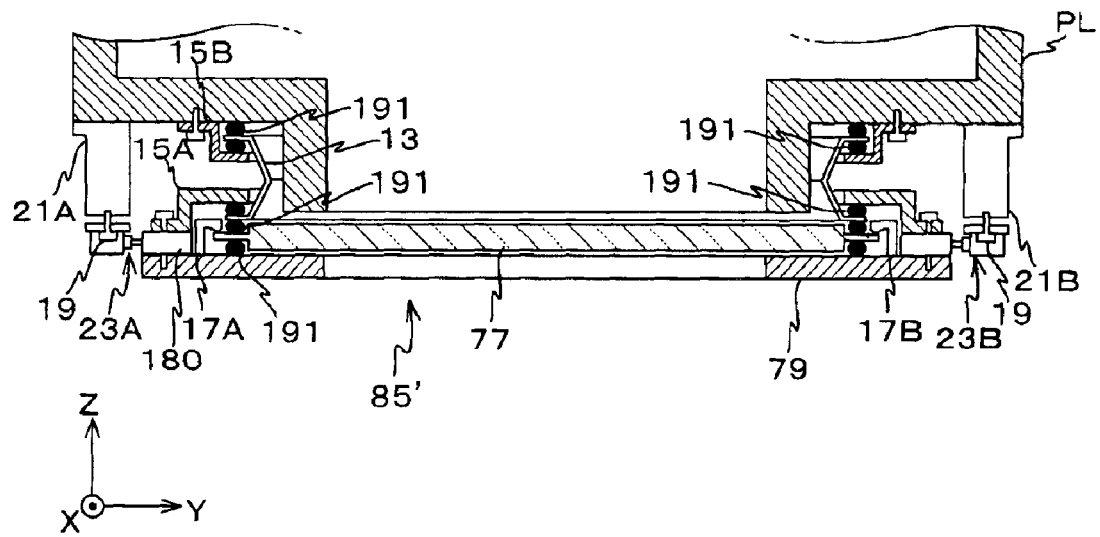
FIG. 17A is a sectional view showing a sealed mechanism related to a second embodiment.
Figure 18:
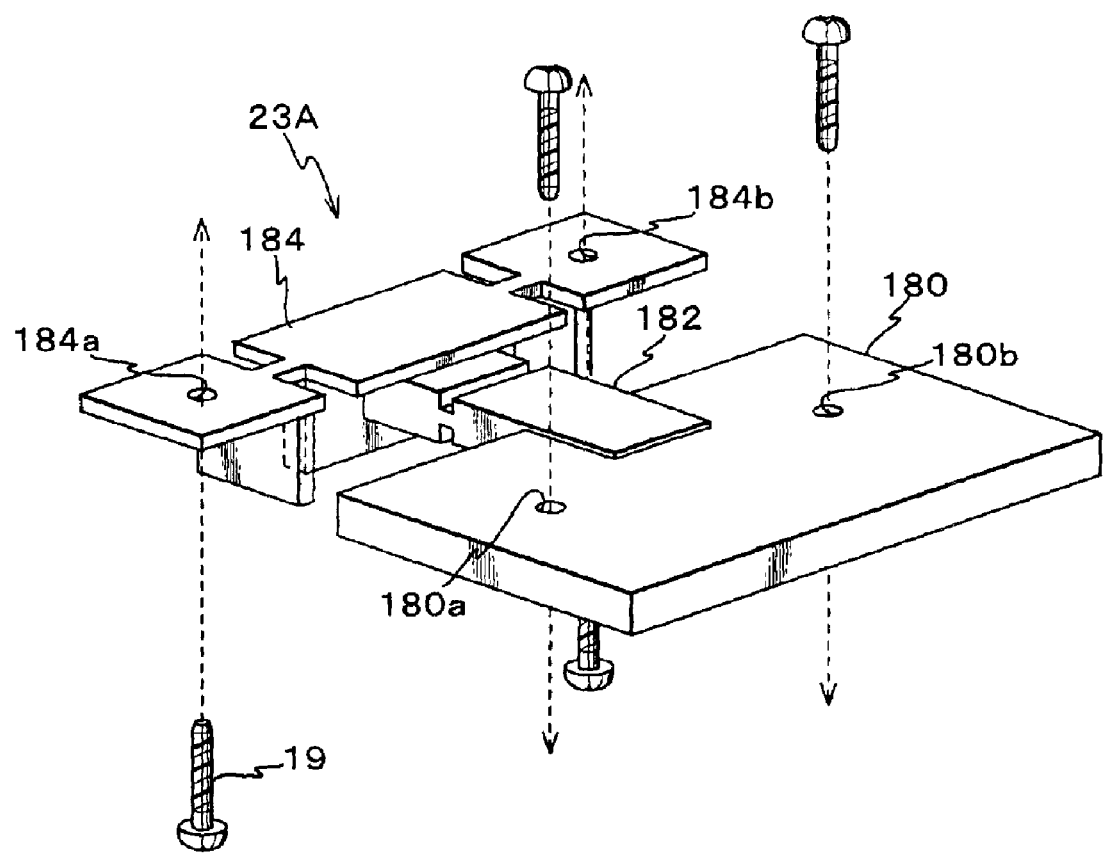
FIG. 18 is an enlarged perspective view of a coupler in FIG. 17A.

Next, a second embodiment of the present invention is described, referring to FIGS. 17A and 18. Structures and components identical or equivalent to those described in the first embodiment are designated with the same reference numerals, and the description thereabout is briefly made or is entirely omitted.

In the second embodiment, instead of seal mechanism 85 provided on the lower end of the projection optical system PL in the first embodiment described earlier, a seal mechanism 85' as is shown in FIG. 17A is provided as a seal mechanism. Other portions are identical with the first embodiment.

In seal mechanism 85', a stop ring 79, which supports a first lens 77 (closest to the image plane) serving as a lens from below at three points at an angle of around 120 degrees close to its circumference portion, is connected to projected portions 21A, 21B, and 21C (projected portion 21C arranged in the depth of the page surface is not shown) provided on the lower end of the barrel portion of projection optical system PL at an angle of around 120 degrees, via couplers 23A to 23C (coupler 23C arranged in the depth of the page surface is not shown) that have low rigidity in the Z-axis direction and high rigidity in the XY plane direction.

More particularly, as in FIG. 17A, the first lens 77 is mounted on the upper surface of stop ring 79 via an O-ring 191 serving as a seal member, and is pressured from above at three points by stoppers 17A, 17B, and 17C (stopper 17C arranged in the depth of the page surface is not shown), similarly as in the above embodiment.

As is shown in the enlarged perspective view in FIG. 18, coupler 23A has a rectangular shaped mounting member 180 and a distortion prevention flexure 184 connected to one end of a direction perpendicular to the longitudinal direction of mounting member 180 via connecting member 182. Circular holes 180a and 180b are formed, respectively, on the areas around both ends of mounting member 180 in the longitudinal direction. Distortion prevention flexure 184 is made of a metal member that has the shape shown in FIG. 18, and it has the properties of rigidity in the Z-axis direction being low while rigidity in the XY plane direction is high. In addition, on the areas around both ends of distortion prevention flexure 184 in the longitudinal direction, circular holes 184a and 184b are formed, respectively, for attachment. Other couplers 23B and 23C also have a structure similar to coupler 23A.

In FIG. 17A, mounting members 180 that form couplers 23A to 23C, respectively, are arranged on the outer side of stoppers 17A, 17B, and 17C. A first bellows fix member 15A, which entire shape is a ring and its sectional shape the letter S, is laid on the upper side of mounting members 180, clamping couplers 23A to 23C with stop ring 79. And, the first bellows fix member 15 and mounting members 180 are screwed to stop ring 79, via circular holes (not shown) formed in the first bellows fix member 15 and circular holes 180a and 180b. In this case, a flange portion formed on a periphery in the lower end of a flexible bellows 13 serving as a third connecting member is clamped between the first bellows fix member 15A and the first lens 77 via O-rings 191 that are vertically arranged.

Distortion prevention flexures 184 that structure couplers 23A to 23C, respectively, are fixed from below to projected portions 21A, 21B, and 21C provided on the lower end of projection optical system at an angle of around 120 degrees with vertical movement drive bolts 19, via circular holes 184a and 184 for attachment, respectively.

Above the first bellows fix member 15A, a second bellows fix member 15B, which is of a similar shape but one size smaller than the first bellows fix member 15A, is arranged vertically reversed. The second bellows fix member 15B is arranged to the lower surface of the barrel of projection optical system PL. In this case, a flange portion formed on a periphery in the upper end of flexible bellows 13 is clamped between the second bellows fix member 15B and projection optical system PL, via O-rings 191 that are vertically arranged.

As is obvious from the description so far, stop ring 79 and the first bellows fix member 15A structure a holding frame, while stop ring 79, the first bellows fix member 15A, and the first lens 77 structure a tilt drive section.

By employing seal mechanism 85' structured in the manner above, the tilt of the first lens 77 can be driven by slightly tightening or loosening vertical movement drive bolts 19, which fix couplers 23A to 23C including the distortion prevention flexures. By making such tilt drive of the first lens 77 possible, astigmatism of projection optical system PL can be corrected. In addition, even if the tilt of the first lens 77 is driven in this manner, the air-tightness inside projection optical system PL is maintained due to parts such as flexible bellows 13. Therefore, for example, even if the inside of projection optical system PL is purged with nitrogen gas and the outside of projection optical system PL, that is, the space SS inside stage chamber 32, is purged with helium gas, the gas flow between both spaces can be prevented, almost without fail. In this case, the fixed mirror, which is the measurement reference when measuring the position of the wafer stages, is fixed to stop ring 79, arranged in space SS in a helium gas environment, therefore, the amount of air fluctuation is low, allowing positional measurement of the wafer stages to be performed with high precision.

<<Third Embodiment>>

Figure 17B:
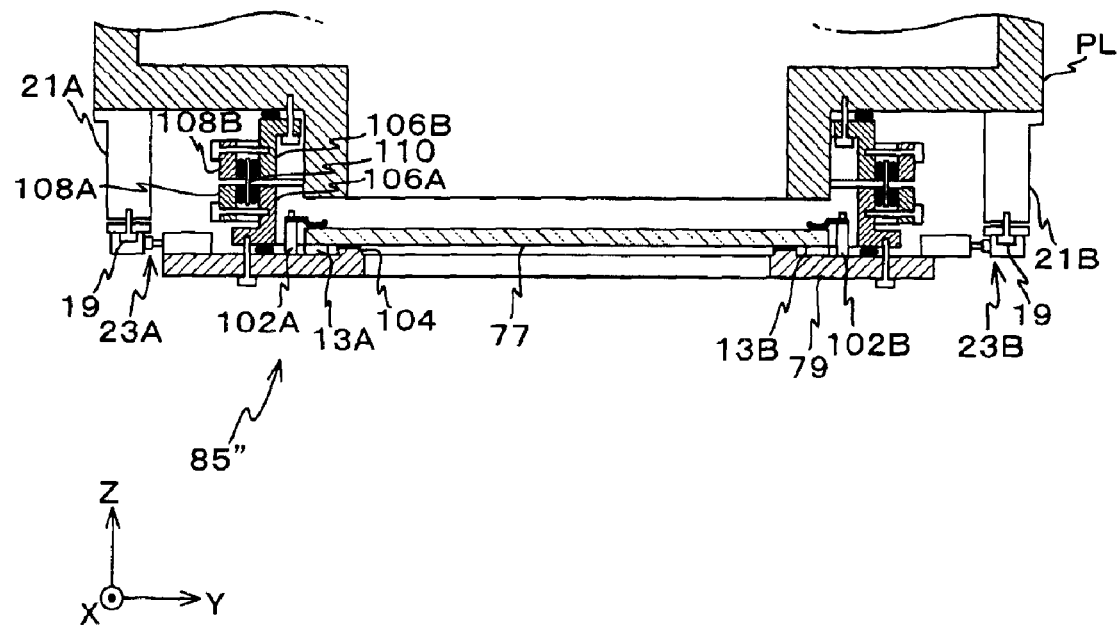
FIG. 17B is a sectional view showing a sealed mechanism related to a third embodiment.

Next, a third embodiment of the present invention is described, referring to FIG. 17B. Structures and components identical or equivalent to those described in the above first and second embodiments are designated with the same reference numerals, and the description thereabout is briefly made or is entirely omitted.

In the third embodiment, instead of seal mechanism 85 provided on the lower end of the projection optical system PL in the first embodiment described earlier, a seal mechanism 85" as is shown in FIG. 17B is provided as a seal mechanism. Other portions are identical with the first embodiment.

In seal mechanism 85", as in the description so far, a first lens 77 (closest to the image plane) is arranged under projection optical system PL. And similar to seal mechanism 85', the first lens 77 is supported from below by a stop ring 79 connected to projected portions 21A, 21B, and 21C (projected portion 21C arranged in the depth of the page surface is not shown) provided on the lower end of the barrel portion of projection optical system PL, via couplers 23A to 23C (coupler 23C arranged in the depth of the page surface is not shown).

In this case, the first lens 77 is arranged on three supports 13A, 13B, and 13C (support 13C arranged in the depth of the page surface is not shown) provided at an angle of around 120 degrees in the periphery of the opening of stop ring 79, and is pressured from above at three points by fasteners 102A, 102B, and 102C having flat springs, which are arranged at positions corresponding to supports 13A, 13B, and 13C. In addition, a ring shaped protrusion 104 is formed at a position on the inner side of supports 13A, 13B, and 13C (closer to the opening) of stop ring 79, and in the space between protrusion 104 and the first lens 77, a viscous member (such as fluorine grease) referred to earlier that can be used in a chemically clean state is applied.

In addition, on the upper surface of stop ring 79, a first stepped circular ring 106A, which has a sectional shape resembling the letter L and which entire shape is a circular ring, is mounted via an O-ring and fixed to stop ring 79 from below. Furthermore, a second stepped circular ring 106B, which entire shape is a circular ring and is vertically symmetric to the first stepped circular ring 106A, is arranged opposing first stepped circular ring 106A and is fixed screwed to the barrel of projection optical system PL via an O-ring.

Furthermore, ring shaped bellows holding members 108A and 108B are screwed to each of the stepped circular rings 106A and 106B from the outer side of the first stepped circular ring 106A and the second stepped circular ring 106B, and a bellows 110 is clamped in between the first stepped circular ring 106A and bellows holding member 108A and in between the second stepped circular ring 106B and bellows holding member 108B, via O-rings.

By employing such sealed mechanism 85", in the third embodiment, the same effect can be obtained as the above second embodiment.

Figure 19:
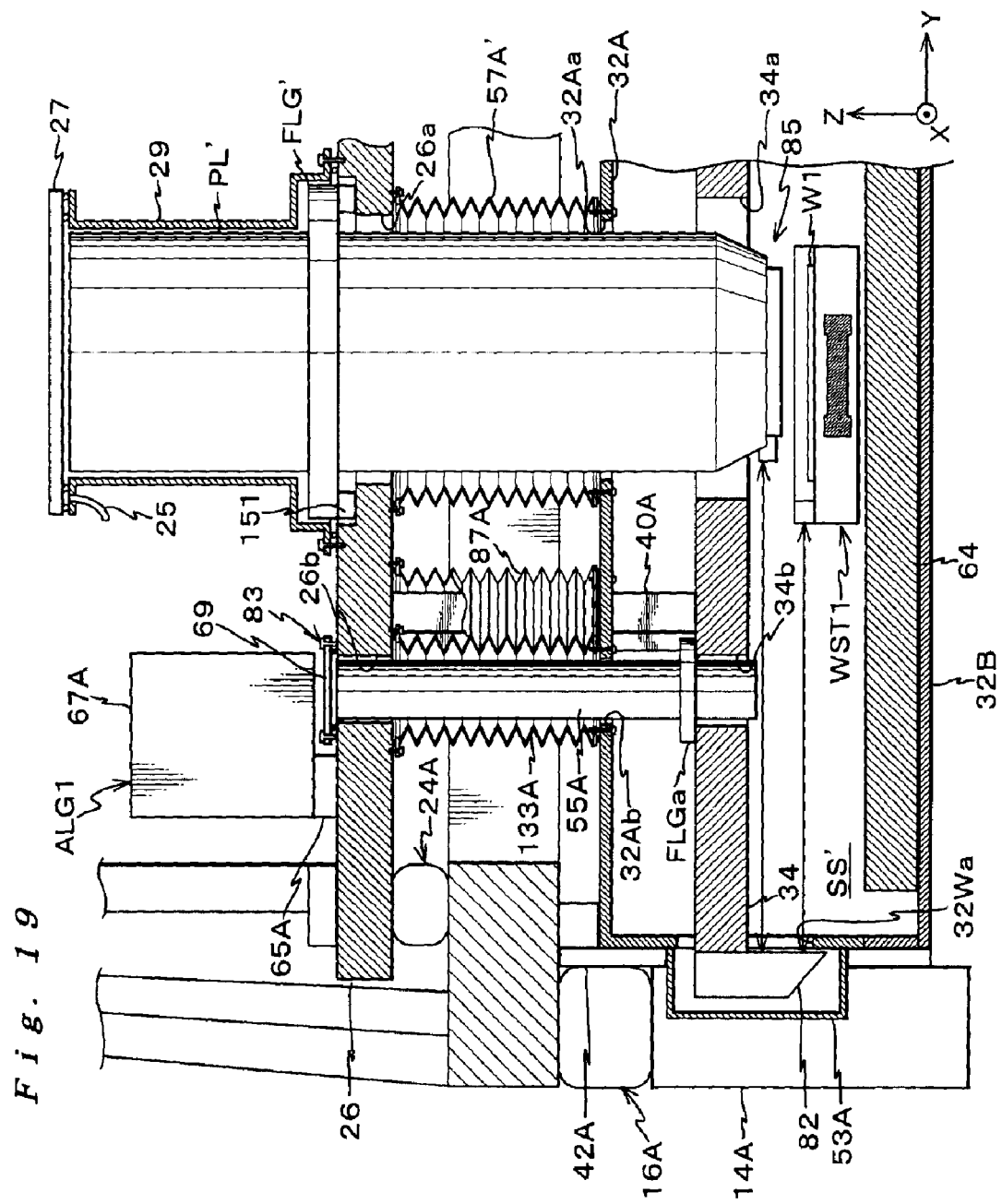
FIG. 19 is a sectional view showing a modified example of a neighboring area of a space within the stage chamber.

In the first, second, and third embodiment above, in order to form a helium gas purge space SS in the periphery of wafer stage device 56, a method of joining the first lens 77 (to be more precise, ring shaped protruded portion 71 located above the first lens 77) of projection optical system PL and upper chamber 32A with flexible bellows 131 is employed, as is shown in FIG. 9. The present invention, however, is not limited to this, and for example, an arrangement like the one shown in FIG. 19 can be employed. In this arrangement, the inside of projection optical system PL' is also purged with helium gas, like the inside of stage chamber 32. Similar to projection optical system PL in the embodiments above, projection optical system PL' is assembled into the main body column BD, in a state where it is inserted into openings 26a, 32Aa, and 34Aa formed in projection optical system support member 26, upper chamber 32A, and sensor column 34, respectively. In addition, in projection optical system PL', a flexible bellows 57' is provided in a state enclosing its periphery and connecting projection optical system support member 26 and upper chamber 32A. Furthermore, a purge cover 29 is arranged above flange FLG' of projection optical system PL' in a state covering the upper half portion of projection optical system PL'. Purge cover 29 is fixed to projection optical system support member 26 by screw via an O-ring. In addition, a purge plate glass 27 is mounted on the upper end portion of purge cover 29, via a double O-ring. In this case, gas in the space enclosed by the double O-ring, purge plate glass 27, and purge cover 29 is vacuumed by a vacuum pump (not shown) via an exhaust piping 25. This creates a vacuumed state inside the space, and purge plate glass 27 is fixed to the purge cover 29, therefore, gas (helium gas) does not flow out from in between purge plate glass 27 and purge cover 29.

By employing such an arrangement, purge plate glass 27 can be fixed to purge cover 29 without using screws or the like, therefore, deformation of the glass surface can be suppressed, and the influence on exposure accuracy can be suppressed. In addition, in this case, since the inside of projection optical system PL' is also purged with helium gas having high heat conductivity and high cooling effect, the increase in lens temperature of the lenses within the projection optical system due to the irradiation of laser beams can be suppressed, which is especially effective when using an ArF excimer laser or an $F_2$ laser as the light source.

In the case of adjusting projection optical system PL', adjustment is to be performed by opening an adjustment window (not shown) provided in purge cover 29.

Instead of purge cover 29, a flexible bellows can be used.

In each of the embodiments above, the case is described when a double stage type wafer stage device is used as the wafer stage device housed in the stage chamber, however, the present invention is not limited to this, and the wafer stage device employed may be of a single stage type.

In addition, in each of the embodiments above, the case is described when the present invention is applied to a scanning exposure apparatus based on a step-and-scan method, however, as a matter of course, the scope of the invention is not limited to this. That is, the present invention can also be suitably applied to a reduction projection exposure apparatus based on a step-and-repeat method.

The usage of the exposure apparatus in the present invention is not limited only to the exposure apparatus used for manufacturing semiconductor devices. For example, the present invention can also be broadly applied to an exposure apparatus for transferring a liquid crystal display device pattern onto a square glass plate when manufacturing liquid crystal displays, or an exposure apparatus used when manufacturing thin film magnetic heads, micromachines, and DNA chips or the like. In addition, not only is the present invention limited to the exposure apparatus for manufacturing microdevices such as semiconductors, but can also be applied to an optical exposure apparatus, an EUV exposure apparatus, an X-ray exposure apparatus, and an exposure apparatus used for transferring a circuit pattern onto a glass substrate or a silicon wafer when manufacturing a reticle or a mask used in an electron beam exposure apparatus.

In addition, the light source of the exposure apparatus in the above embodiments is not limited to an ultraviolet light source such as an F2 laser light source, an ArF excimer light source, or a KrF excimer light source, and an ultra-high pressure mercury lamp emitting an emission line such as a g-lire. (wavelength: 436 nm) or an i-line (wavelength: 365 nm) can be used.

In addition, a harmonic may be used as the illumination light for exposure, which is obtained by amplifying a single-wavelength laser beam in the infrared or visible range emitted by a DFB semiconductor laser or fiber laser, with a fiber amplifier doped with erbium (or both erbium and ytteribium), and by converting the wavelength into ultraviolet light using a nonlinear optical crystal. In addition, the magnification of the projection optical system is not limited only to a reduction system, but may either be an equal magnification or an enlarged magnification.

Semiconductor devices are manufactured through the following steps: the step of designing the function and performance of the device; the step of manufacturing a reticle based on the design step; the step of manufacturing a wafer from a silicon material; the step of transferring a reticle pattern onto a wafer by using the exposure apparatus of the above embodiments; the step of assembling the device (including dicing bonding, and packaging process), the inspection step, and the like. Following is a detailed description of a device manufacturing method.

<<Device Manufacturing Method>>

Figure 20:
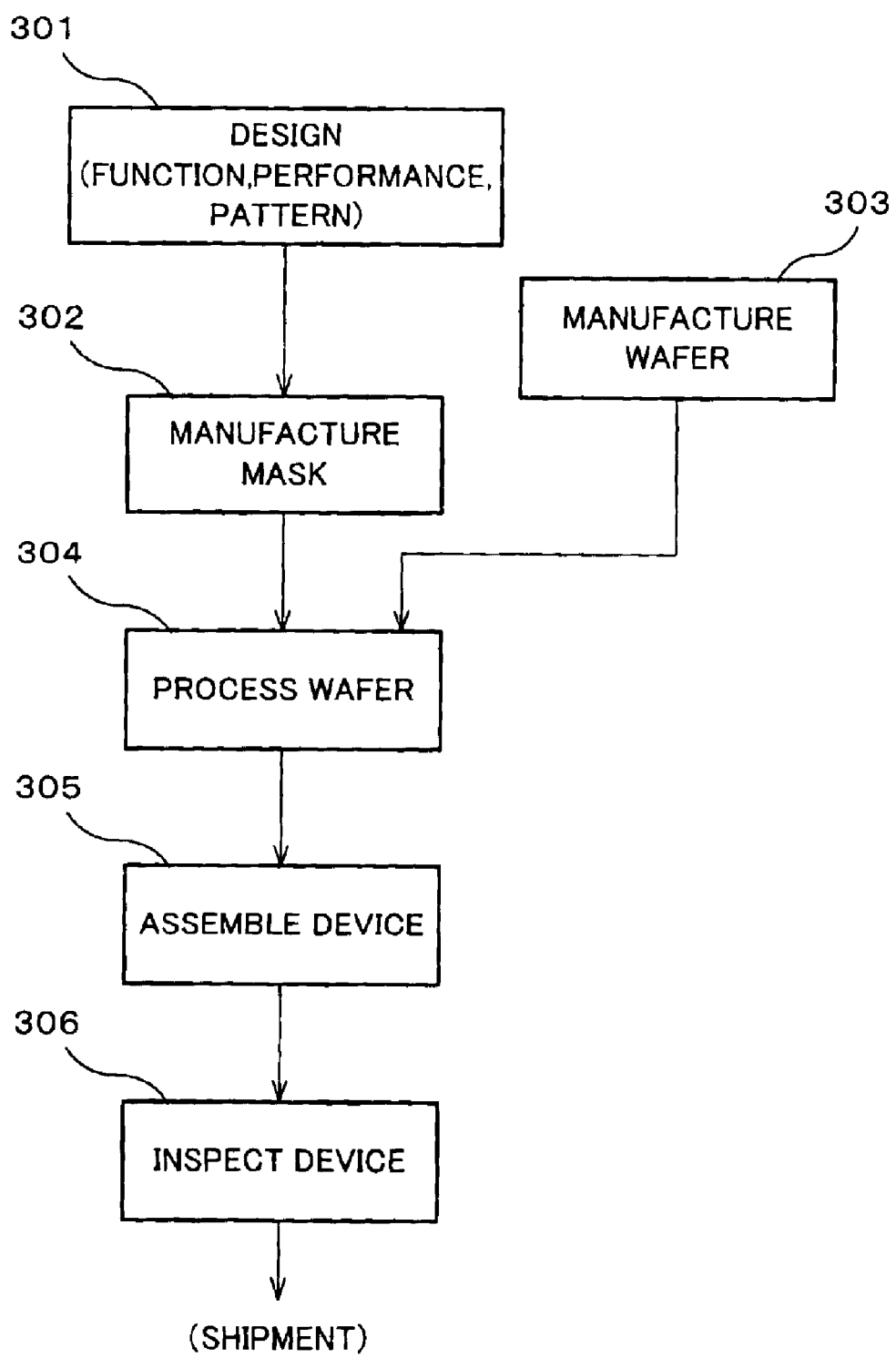
FIG. 20 is a flow chart for explaining an embodiment of a device manufacturing method according to the present invention.

FIG. 20 is a flow chart showing an example of manufacturing a device (a semiconductor chip such as an IC or LSI, a liquid crystal panel, a CCD, a thin magnetic head, a micromachine, or the like). As shown in FIG. 20, in step 301 (design step), function/performance is designed for a device (e.g., circuit design for a semiconductor device) and a pattern to implement the function is designed. In step 302 (mask manufacturing step), a mask on which the designed circuit pattern is formed is manufactured. In step 303 (wafer manufacturing step), a wafer is manufacturing by using a silicon material or the like.

In step 304 (wafer processing step), an actual circuit and the like is formed on the wafer by lithography or the like using the mask and wafer prepared in steps 301 to 303, as will be described later. Next, in step 305 (device assembly step) a device is assembled using the wafer processed in step 304. The step 305 includes processes such as dicing, bonding, and packaging (chip encapsulation), as necessary.

Finally, in step 306 (inspection step), tests on operation, durability, and the like are performed on the device made in step 305. After these steps, the device is completed and shipped out.

Figure 21:
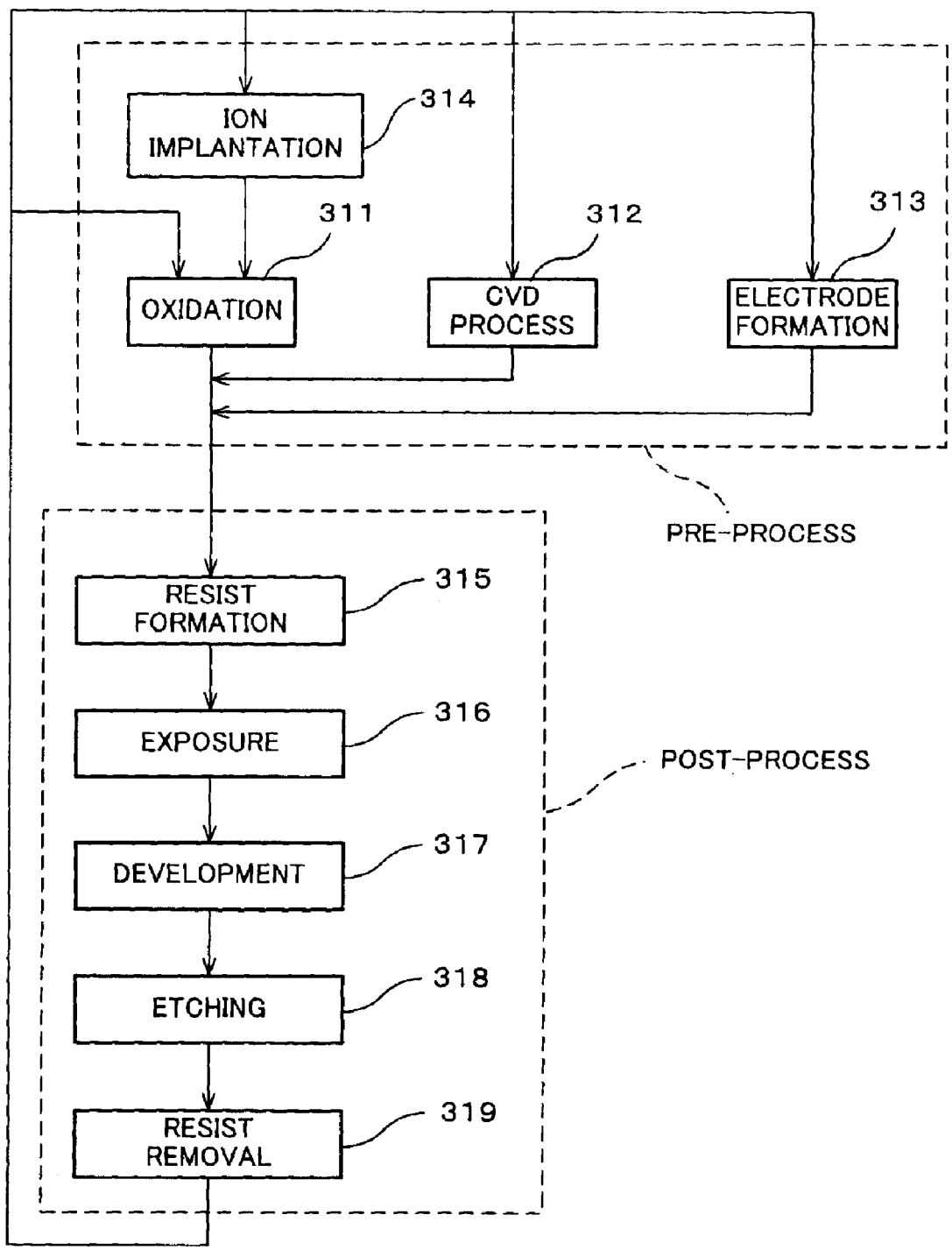
FIG. 21 is a flow chart for showing a process in step 304 in FIG. 20.

FIG. 21 is a flow chart showing a detailed example of step 304 described above, in the case of manufacturing a semiconductor device. Referring to FIG. 21, in step 311 (oxidation step), the surface of the wafer is oxidized. In step 312 (CVD step), an insulating film is formed on the wafer surface. In step 313 (electrode formation step), an electrode is formed on the wafer by vapor deposition. In step 314 (ion implantation step), ions are implanted into the wafer. Steps 311 to 314 described above constitute a pre-process for the respective steps in wafer processing and are selectively executed based on the processing required in the respective steps.

When the above pre-process is completed in the respective steps in the wafer process, a post-process is executed in the following manner. In the post-process, first, in step 315 (resist formation step), the wafer is coated with a photosensitive agent. Next, in step 316, the circuit pattern on the mask is transferred onto the wafer by the exposure apparatus described in the above embodiments. Then, in step 317 (developing step), the exposed wafer is developed. In step 318 (etching step), an exposed member of an area other than the area where the resist remains is removed by etching. Finally, in step 319 (resist removing step), when etching is completed, the resist that is no longer necessary is removed.

By repeatedly performing these pre-process and post-process steps, multiple circuit patterns are formed on the wafer.

When using the device manufacturing method described so far in the embodiments, since exposure apparatus 10 in the above embodiments is used in the exposure process (step 316), a pattern can be accurately transferred onto a wafer, which leads to producing high integration microdevices with high productivity (including yield).

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that transfers a pattern formed on a mask onto a substrate via a projection optical system, the exposure apparatus comprising:

a first stage that is movably supported by a base;

a second stare that is different from the first stage, the second stage being movably supported by the base;

a first main body unit that supports the first stage, the second stage and the base;

four first vibration isolators that support the first main body unit at four points and isolate vibration in the first main body unit;

a second main body unit that supports the projection optical system; and three second vibration isolators that support the second main body unit at three points on different straight lines on the first main body unit and isolate vibration in the second main body unit.

2. The exposure apparatus of claim 1 wherein the four first vibration isolators support the first main body unit at each corner of in a square shape.

3. The exposure apparatus of claim 1 wherein each of the second vibration isolators is an active vibration isolator that includes an actuator.

4. The exposure apparatus of claim 3 wherein provided in the second main body unit are at least one of an interferometer that measures a position of at least one of the first and second stages, a position detector that measures at least a position of the substrate in an optical axis direction of the projection optical system and a tilt, and a mark detection system that detects a position of marks on the substrate, and a vibration sensor that detects vibration in the second main body unit, and the exposure apparatus further comprises:

a controller that performs posture control of the second main body unit by controlling the actuators based on an output of the vibration sensor.

5. The exposure apparatus of claim 4 wherein the controller performs the posture control in direction of three degrees of freedom, in the optical axis direction of the projection optical system and in rotational directions around two orthogonal axes within a plane perpendicular to the optical axis.

6. The exposure apparatus of claim 1 wherein the second main body unit supports the projection optical system at three points via a kinematic support mechanism.

7. The exposure apparatus of claim 1 wherein the first main body unit holds the mask stage.

8. The exposure apparatus of claim 1 wherein the first stage holds a first substrate and the second stage holds a second substrate.

9. The exposure apparatus of claim 1 wherein the first stage comprises a first reflective member and the second stage comprises a second reflective member.

10. The exposure apparatus of claim 9, further comprising:

a first interferometer system that cooperates with the first reflective member to detect a position of the first stage: and a second interferometer system that cooperates with the second reflective member to detect a position of the second stage.

* * * * *